US012588201B2

(12) United States Patent (10) Patent No.: US 12,588,201 B2
Chen et al. (45) Date of Patent: Mar. 24, 2026

(54) MEMORY DEVICE WITH INCREASED DENSITY AND METHOD OF FABRICATING THE SAME

(71) Applicant: Winbond Electronics Corp., Taichung City (TW)

(72) Inventors: Frederick Chen, San Jose, CA (US); Wei-Che Chang, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 574 days.

(21) Appl. No.: 17/993,997

(22) Filed: Nov. 25, 2022

(65) Prior Publication Data

US 2024/0179903 A1 May 30, 2024

(51) Int. Cl.
H10B 43/27 (2023.01)
H10B 43/10 (2023.01)

(52) U.S. Cl.
CPC ............. H10B 43/27 (2023.02); H10B 43/10 (2023.02)

(58) Field of Classification Search
CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 2013/0207225 A1* | 8/2013 | Sakui | H10D 30/689 |
| | | | 257/E27.081 |
| 2016/0268201 A1 | 9/2016 | Chen | |
| 2018/0019257 A1* | 1/2018 | Son | H10B 43/30 |
| 2019/0123061 A1* | 4/2019 | Liu | G11C 11/2273 |
| 2021/0135010 A1* | 5/2021 | Yamazaki | H10B 43/27 |
| 2022/0013536 A1* | 1/2022 | Geng | H10B 43/27 |

FOREIGN PATENT DOCUMENTS

TW            I538102            6/2016

* cited by examiner

*Primary Examiner* — William B Partridge
*Assistant Examiner* — Gustavo G Ramallo
(74) *Attorney, Agent, or Firm* — JCIPRNET

(57) ABSTRACT

Provided is a flash memory device including a gate stack structure, at least three channel pillars, a charge storage structure, at least three source line, and at least three bit lines. The gate stack structure is disposed above a substrate. The gate stack structure includes a plurality of gate layers and a plurality of insulating layers stacked alternately each other. The at least three channel pillars extend through the gate stack structure. The at least three channel pillars are electrically isolated from one another. The charge storage structure is disposed between the plurality of gate layers and the at least three channel pillars. The at least three source line are disposed below the gate stack structure and electrically connected to the at least three channel pillars. The at least three bit lines are disposed above the gate stack structure, and electrically connected to the at least three channel pillars.

19 Claims, 21 Drawing Sheets

MEMORY DEVICE WITH INCREASED DENSITY AND METHOD OF FABRICATING THE SAME

BACKGROUND

Technical Field

The embodiment of the present disclosure relates to a semiconductor device and a manufacturing method thereof, and particularly relates to a memory device and a manufacturing method thereof.

Description of Related Art

The flash memory has the advantage that the stored data will not disappear even after the power is off, so becomes a widely used memory device for many electronic devices. Although three dimensional NAND flash memory developed with the evolution of processes may improve the integration density of memory devices, there still exist many related challenges.

SUMMARY

The present disclosure provides a flash memory device and a method of fabricating the same, which may improve memory cell density.

An embodiment of the present invention provides a flash memory device. The flash memory device includes a gate stack structure, at least three channel pillars, a charge storage structure, at least three source lines, and at least three bit lines. The gate stack structure is disposed above a substrate. The gate stack structure includes a plurality of gate layers and a plurality of insulating layers vertically stacked alternately. The at least three channel pillars extend through the gate stack structure. The at least three channel pillars are electrically isolated from one another. The charge storage structure is disposed within each of the gate layers surrounding the at least three channel pillars. The at least three source line are disposed below the gate stack structure and electrically connected to the at least three channel pillars. The at least three bit lines are disposed above the gate stack structure, and electrically connected to the at least three channel pillars.

An embodiment of the present invention provides a method for manufacturing a flash memory device. At least three source lines are formed over a substrate. A stack structure is formed over the at least three source lines. The stack structure includes a plurality of gate layers and a plurality of insulating layers stacked alternately. A hole is formed in the stack structure. A charge storage structure is formed on sidewalls of the hole. A semiconducting layer is formed in the hole. The semiconducting layer is patterned to form at least three channel pillars. The at least three channel pillars are connected to the at least three source lines. An insulating layer is formed in a remaining space of the hole. At least three bit lines are formed over the gate stack structure. The at least three bit lines are electrically connected to the at least three channel pillars.

An embodiment of the present invention provides a method for manufacturing a flash memory device. At least three source line are formed over a substrate. A stack structure is formed above the at least three source lines. The stack structure includes a plurality of first material layers and a plurality of second material layers stacked alternately. A hole is formed in the stack structure. A semiconducting layer is formed in the hole. A filling pillar is formed in the semiconducting layer. The plurality of second material layers are removed to form a plurality of horizontal openings. A plurality of charge storage structures and a plurality of gate layers are formed in the plurality of horizontal openings. The semiconducting pillar in the hole is patterned to form at least three channel pillars. The at least three channel pillars are connected to the at least three source lines. An insulating material fills the remaining space of the hole. At least three bit lines are formed over the gate stack structure. The at least three bit lines are electrically connected to the at least three channel pillars.

An embodiment of the present invention provides a phase change memory device including a gate stack structure, at least three pillars, at least three source lines, and at least three bit lines. The gate stack structure is disposed above a substrate, wherein the gate stack structure includes a plurality of gate layers and a plurality of insulating layers vertically stacked alternately. The at least three channel pillars extends through the gate stack structure, wherein the at least three channel pillars are electrically isolated from one another, wherein an outer region of each channel pillar is a semiconducting channel region, and an inner region of each channel pillar is a phase change memory region. The at least three source lines are disposed below the gate stack structure, and electrically connected to the at least three channel pillars. The at least three bit lines are disposed above the gate stack structure, and electrically connected to the at least three channel pillars.

In view of above, in many embodiments of the present disclosure, each charge storage structure or each phase change memory region is coupled to one of the three channel pillars, so that the memory cells may be more closely arranged, thereby increasing the number of memory cells per chip area and increase the density of memory cells.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1K are schematic cross-sectional views and schematic perspective views illustrating intermediate stages in a fabricating method of a three dimensional flash memory device with a gate-first process according to an embodiment of the present disclosure. FIG. 2A to FIG. 2C are schematic top views taken along line I-I' of FIG. 1F to FIG. 1H.

Figures 1A, 1B, 1C:
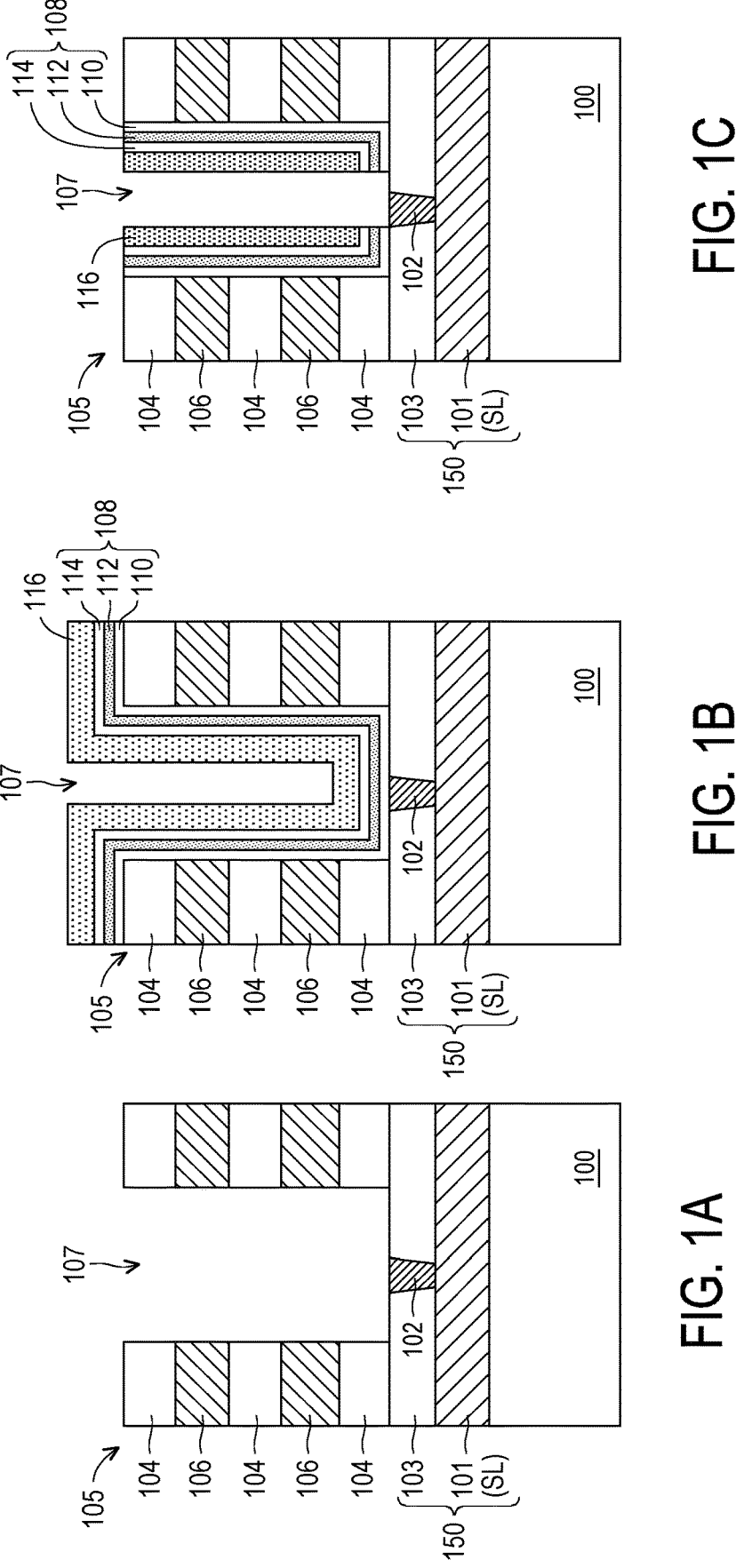
FIG. 1A to FIG. 1K and FIG. 3A to FIG. 3G are schematic cross-sectional views and schematic perspective views illustrating intermediate stages in a manufacturing method of a three dimensional flash memory device with a gate-first process according to different embodiments of the present disclosure.
Figure 1E:
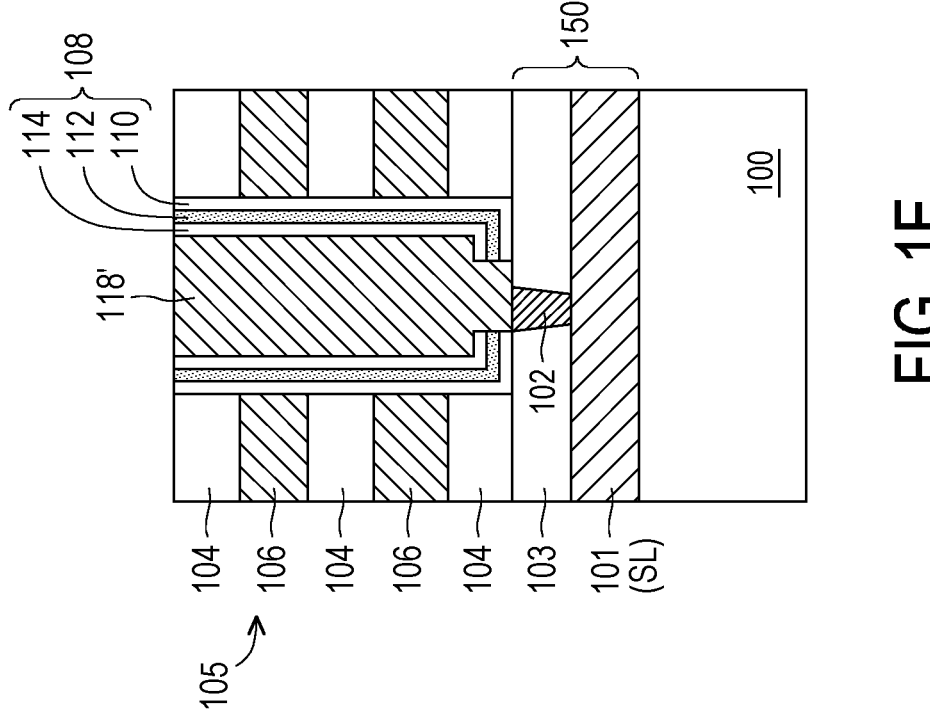
Figure 1D:
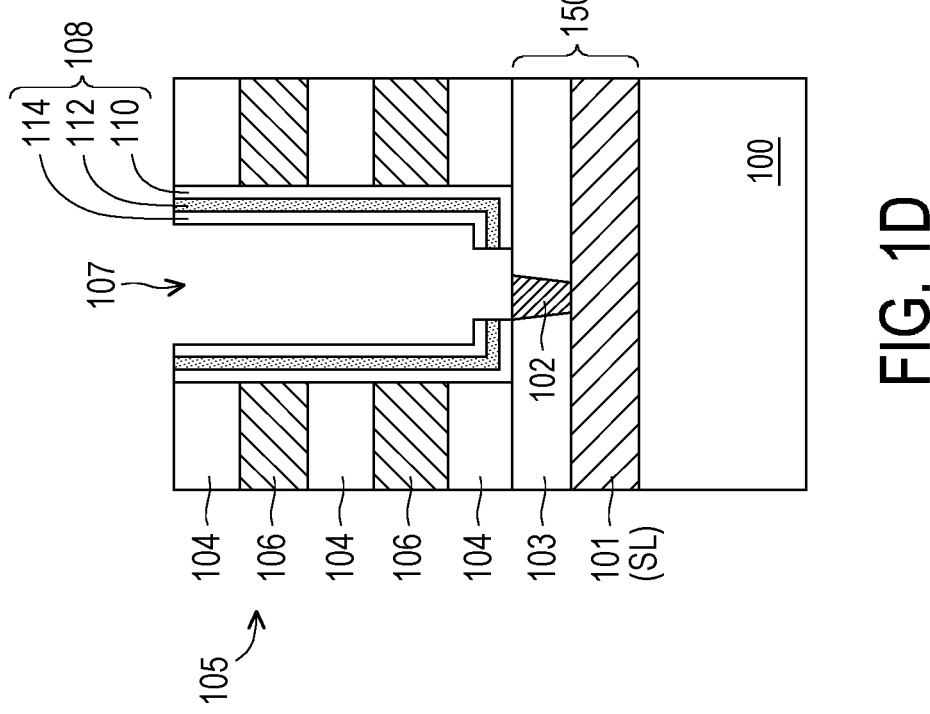
Figures 1F, 1G:
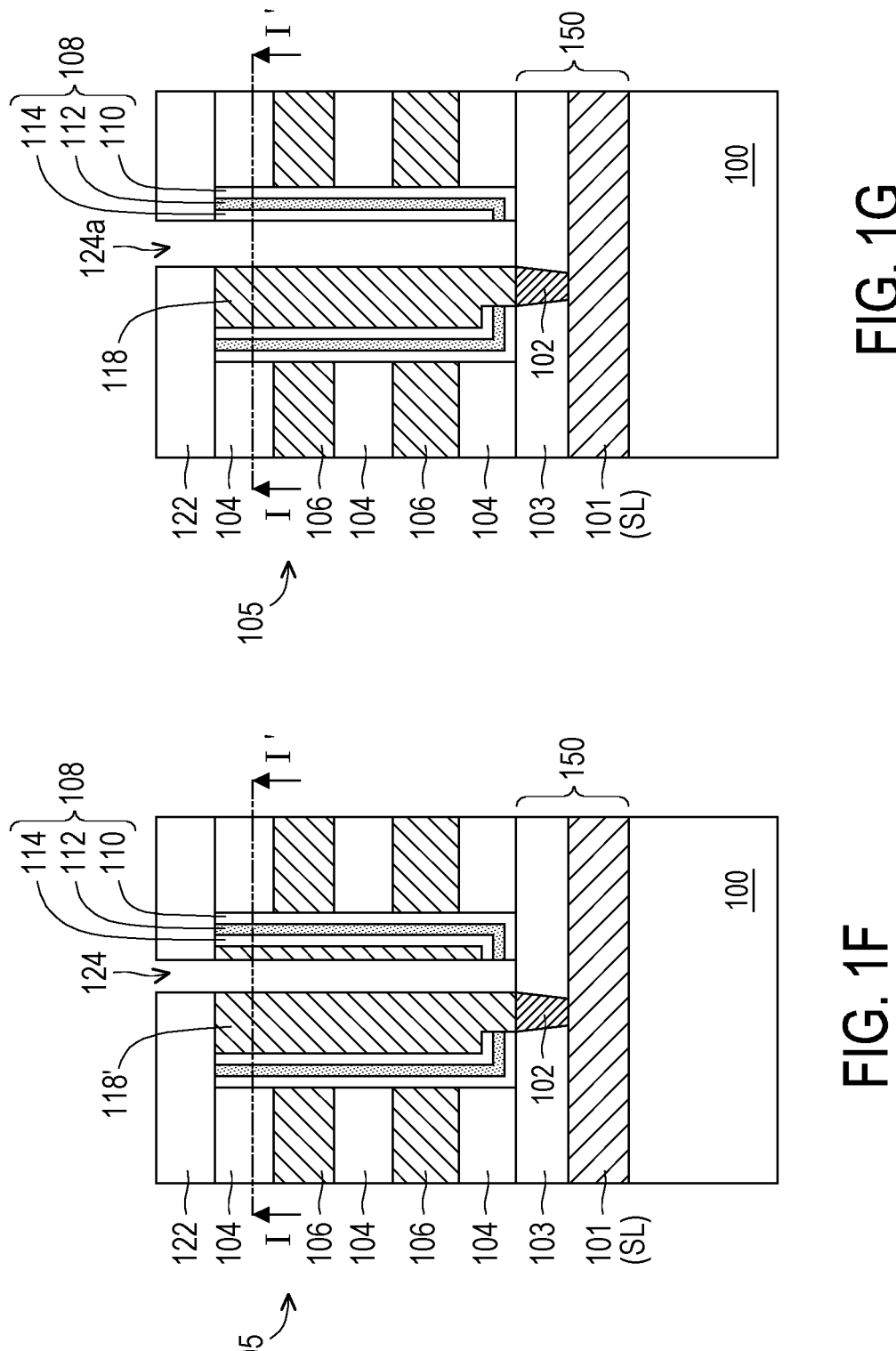
Figure 1I:
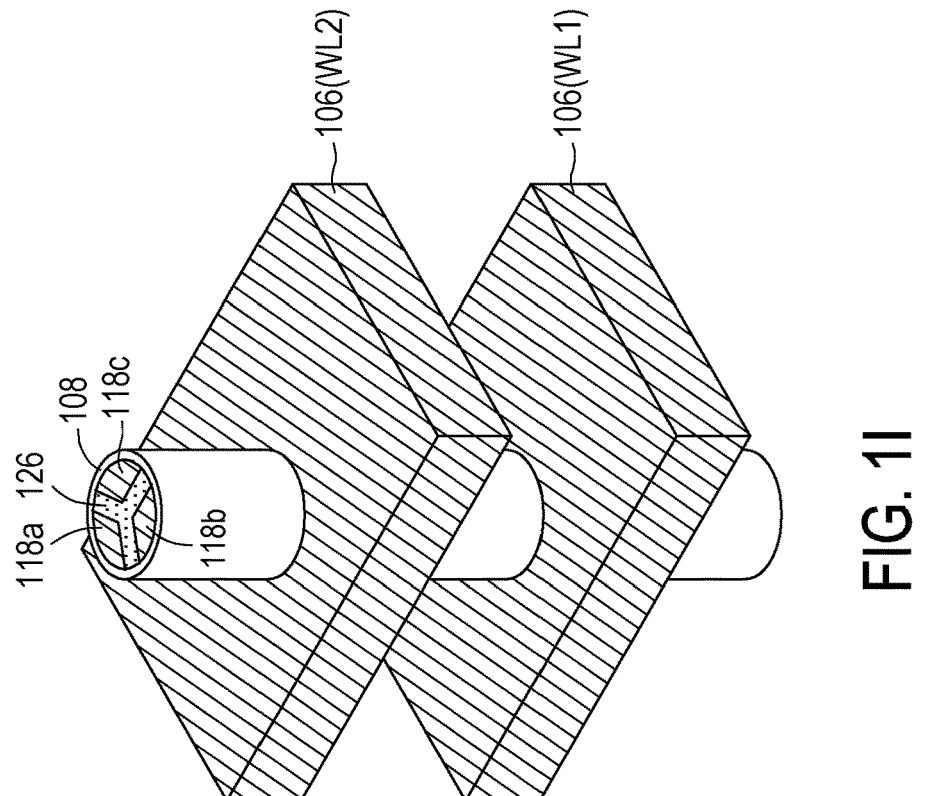
Figure 1H:
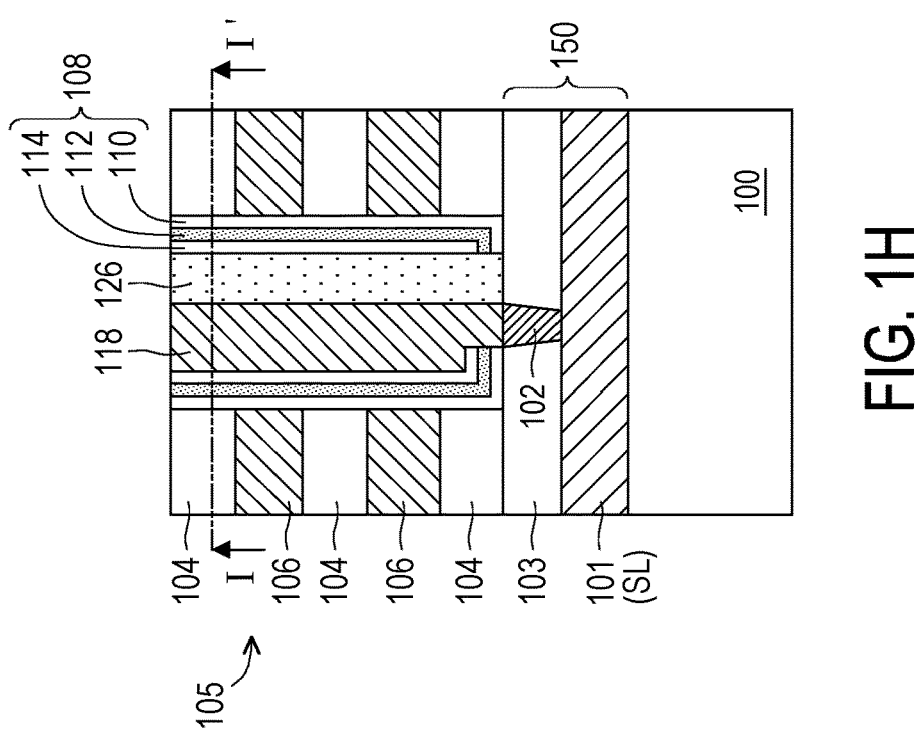
Figure 1K:
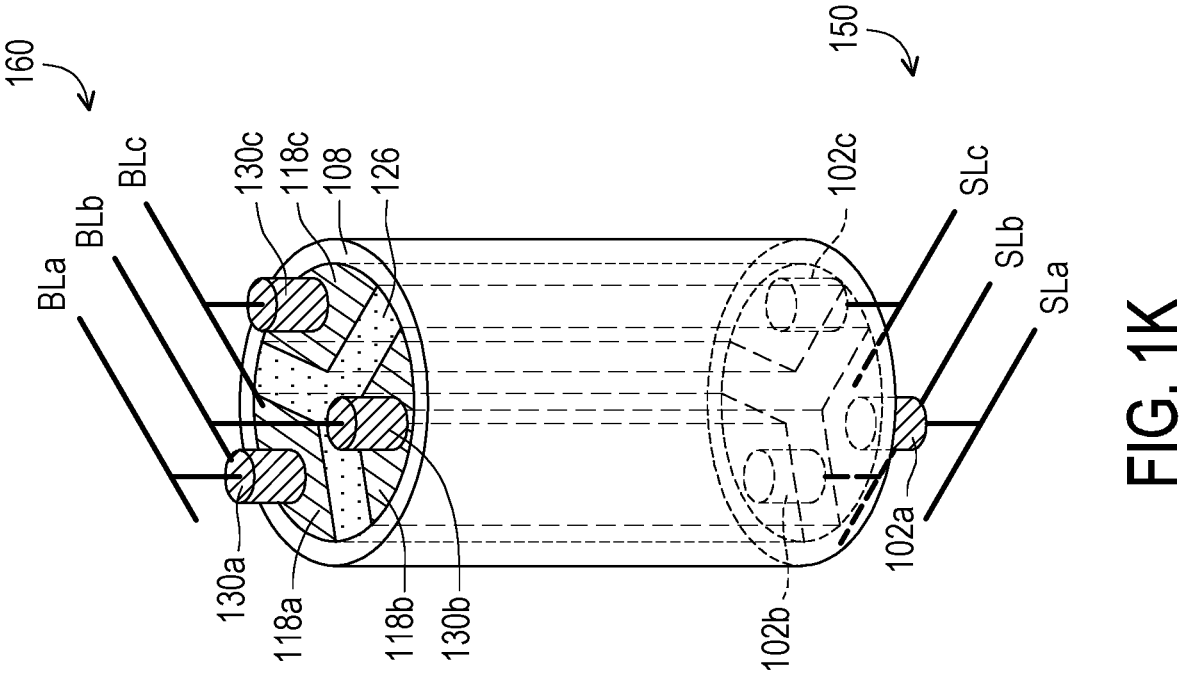
Figure 1J:
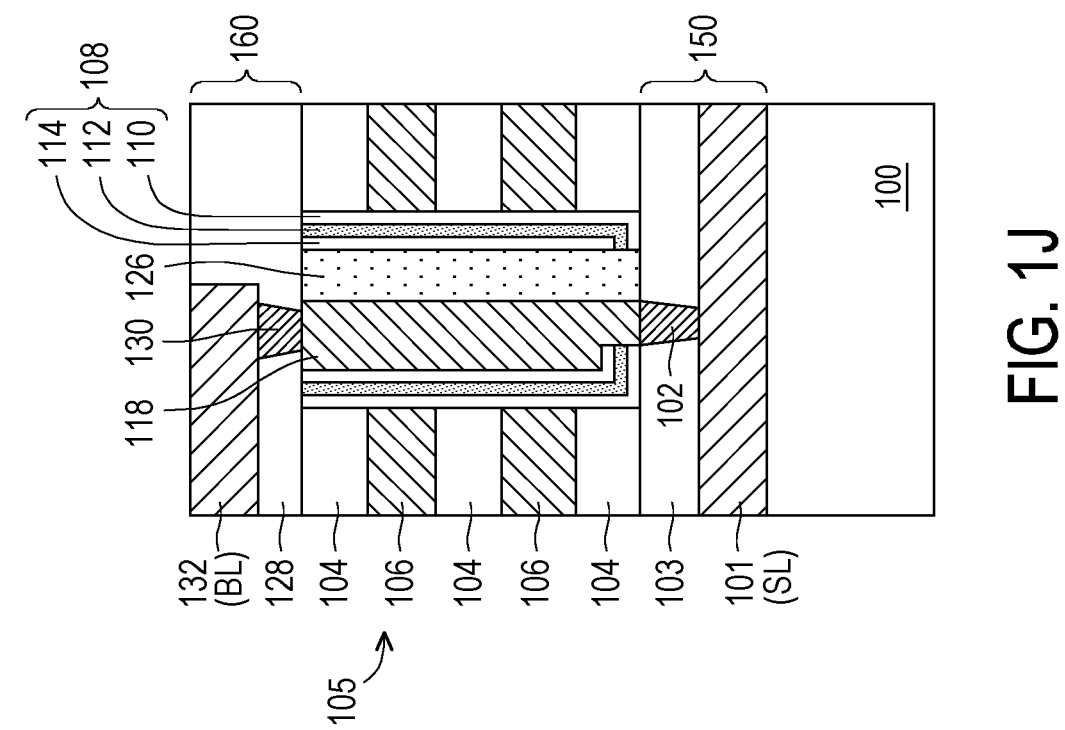
Figures 2A, 2B, 2C:
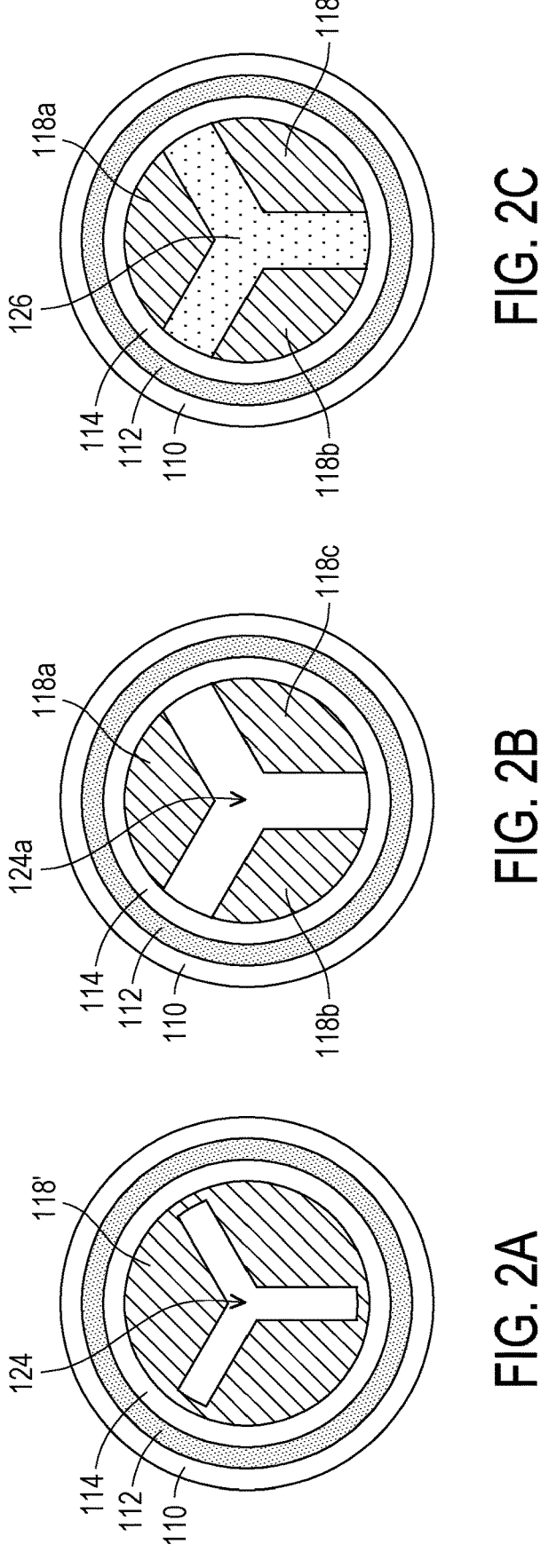
FIG. 2A to FIG. 2C are schematic top views taken along line I-I' of FIG. 1F to FIG. 1H.

Referring to FIG. 1A, FIG. 1I and FIG. 1J, a substrate 100 is provided. The substrate 100 may include a device layer (not shown) on a semiconductor substrate and an interconnect structure 150 on the device layer. The device layer may include active devices or passive devices. The active devices are, for example, transistors, diodes, and so on. The passive devices are, for example, capacitors and inductors. The interconnect structure 150 may include conductive lines 101, dielectric layer 103, plugs 102, etc., but is not limited thereto. The conductive lines 101 may be used as source line SL, as shown in FIG. 1A and FIG. 1J. The source line SL may include source lines SLa, SLb, and SLc, as shown in FIG. 1K. The material of the conductive lines 101 includes doped polysilicon, copper or tungsten. The dielectric layer 103 is formed on the conductive lines 101. The material of the dielectric layer 103 includes silicon oxide. The plugs 102 are formed in the dielectric layer 103 and may be electrically connected to the conductive lines 101. For example, the plugs 102 may include plugs 102a. 102b, and 102c, which are electrically connected to source lines SLa, SLb, and SLc, respectively, as shown in FIG. 1K.

Referring to FIG. 1A, the stack structure 105 is formed over in the substrate 100. The stack structure 105 includes a plurality of first material layers 104 and a plurality of second material layers 106 alternately stacked on each other. The first material layer 104 may be an insulating layer, such as silicon oxide. The second material layer 106 may be a conductive layer, such as doped polysilicon. The second material layer 106 may be used as a word line. In this embodiment, the bottom layer and the top layer of the stack structure 105 are both the first material layer 104, but the present disclosure is not limited to this. In addition, in this embodiment, three first material layers 104 and two second material layers 106 are used for illustration, however, the present disclosure is not limited to this.

A patterning process is performed to remove part of the stack structure 105 to form one or more holes 107 extending through the stack structure 105. In an embodiment, the hole 107 may have a substantially vertical sidewall. In another embodiment, the hole 107 may have a slightly inclined sidewall (not shown).

Referring to FIG. 1B, a charge storage structure 108 are formed on sidewalls of the hole 107. The charge storage structure 108 includes, for example, a blocking layer 110, a storage layer 112 and a tunneling layer 114. The blocking layer 110, the storage layer 112, and the tunneling layer 114 are, for example, conformal layers, which may be formed by a thermal oxidation or a chemical vapor deposition. The materials of the blocking layer 110, the storage layer 112, and the tunneling layer 114 are, for example, silicon oxide, silicon nitride, and silicon oxide. In some embodiments, the material of the blocking layer 110 is, for example, a high dielectric constant material having a dielectric constant greater than or equal to 7, or a ferroelectric material such as aluminum oxide ($Al_2O_3$), hafnium oxide ($HfO_2$), lanthanum oxide ($La_2O_5$), transition metal oxide, lanthanide oxide, or combinations thereof. Next, a mask layer 116 is formed on the charge storage structure 108. The mask layer 116 may be silicon nitride.

Referring to FIG. 1C, an etch-back process is performed to remove a portion of the mask layer 116 and the charge storage structure 108 and expose the plugs 102 and the dielectric layer 103.

Referring to FIG. 1D, the mask layer 116 is removed to expose sidewalls of the tunneling layer 114.

Referring to FIG. 1E, a semiconducting layer (or referred to as a channel layer) 118' is formed in the hole 107. The formation method of the semiconducting layer 118' is, for example, using a chemical vapor deposition to form a semiconducting material above the stack structure 105 and in the hole 107, and then chemical mechanical polishing process is performed to remove the semiconducting material above the stack structure 105. The semiconducting material is undoped polysilicon, for example.

Referring to FIG. 1F and FIG. 2A, a patterned hard mask 122 is formed over the stack structure 105. After that, the first stage etching process is performed on the semiconducting layer 118' to form an opening 124, and the semiconducting layer 118' is exposed in the opening 124. The first stage etching process is, for example, a dry etching process.

Referring to FIG. 1G, FIG. 2B, FIG. 1I, and FIG. 1K, a second-stage etching process is performed to expand the opening 124 into the opening 124a. The second stage etching process is, for example, a wet etching process. Sidewalls of the tunneling layer 114 are exposed in the opening 124a. The semiconducting layer 118' is divided into channel pillars 118. In some embodiments, the channel pillars 118 may include channel pillars 118a, 118b, and 118c separated from each other. The channel pillars 118a, 118b, and 118c are respectively electrically connected to the plugs 102a. 102b, and 102c. From a top view, the shape of the channel pillar 118a, 118b, or 118c is, for example, a circular sector or a portion of an annulus. The circular sector here comprises two radii and one arc.

Referring to FIG. 1H and FIG. 2C, an insulating pillar 126 is formed in the opening 124a, so that the channel pillars 118a. 118b, 118c are electrically isolated from one another. The material of the insulating pillar 126 is silicon oxide, for example. The forming method of the insulating pillar 126 is, for example, forming a Y-shaped opening 124a through the stack structure 105 and filling into the opening 124a, and then performing an etch-back or chemical mechanical polishing process to remove the insulating material on the stack structure 105. From a top view, the shape of the insulating pillar 126 is, for example, a Y-shape as shown in FIG. 2C. The insulating pillar 126 electrically isolates the channel pillars 118a. 118b, and 118c from each other, as shown in FIG. 2C. FIG. 1I, and FIG. 1K.

Referring to FIG. 1J, an interconnect structure 160 is formed on in the stack structure 105. The interconnect structure 160 may include a dielectric layer 128, plugs 130 and conductive lines 132 and the like, but not limited thereto. The dielectric layer 128 is formed on the stack structure 105. The dielectric layer 128 may include a single layer or multiple layers. The material of the dielectric layer 128 includes silicon oxide, silicon nitride, or a combination thereof. The plugs 130 (e.g., 130a. 130b, or 130c) are formed in the dielectric layer 128, and may be electrically connected to the channel pillar 118a, 118b, or 118c, as shown in FIG. 1K. The material of plugs 130 may include tungsten. The conductive lines 132 may be used as bit lines BL, which are formed in the dielectric layer 128 and are electrically connected to the plugs 130. For example, the bit line BL may include bit line BLa, BLb, and BLc, which are electrically connected to the plugs 130a. 130b, and 130c, respectively, as shown in FIG. 1K. The material of the conductive lines 132 may include copper or tungsten.

Referring to FIGS. 1I, 1J, and 1K, the plurality of second material layers 106 serving as word lines WL1 and WL2 are stacked on the substrate 100, and are electrically isolated from each other by the first material layer 104. The plurality of channel pillars 118, for example, three channel pillars 118a. 118b, and 118c extend through the plurality of second material layers 106. The charge storage structure 108 is located between the channel pillars 118a, 118b, 118c and the plurality of second material layers 106. As shown in FIG. 1K, the channel pillars 118a. 118b, and 118c are respectively electrically connected to the source lines SLa, SLb, and SLc through the plugs 102a, 102b, and 102c disposed below, respectively. The channel pillars 118a, 118b, and 118c are electrically connected to the bit lines BLa, BLb, and BLc through the plugs 130a. 130b, and 130c disposed above, respectively.

Figure 3B:
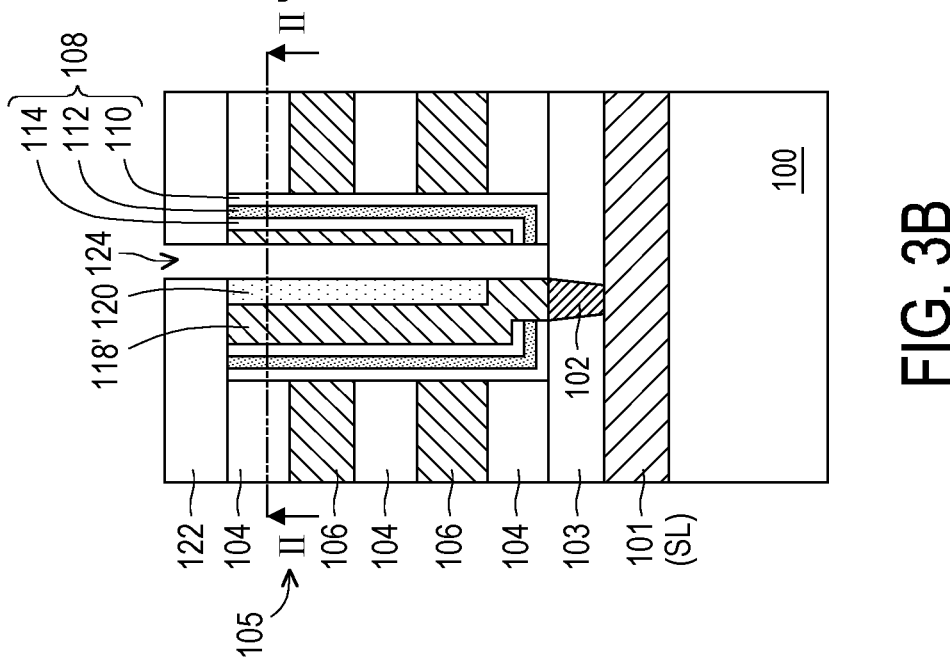

FIG. 3A to FIG. 3G are cross-sectional schematic view and schematic perspective view illustrating intermediate stages in a manufacturing method of a three dimensional flash memory device with a gate-first process according to an embodiment of the present disclosure. FIG. 4A to FIG. 4C are schematic top views taken along line II-II' of FIG. 3B to FIG. 3D.

Figure 3A:
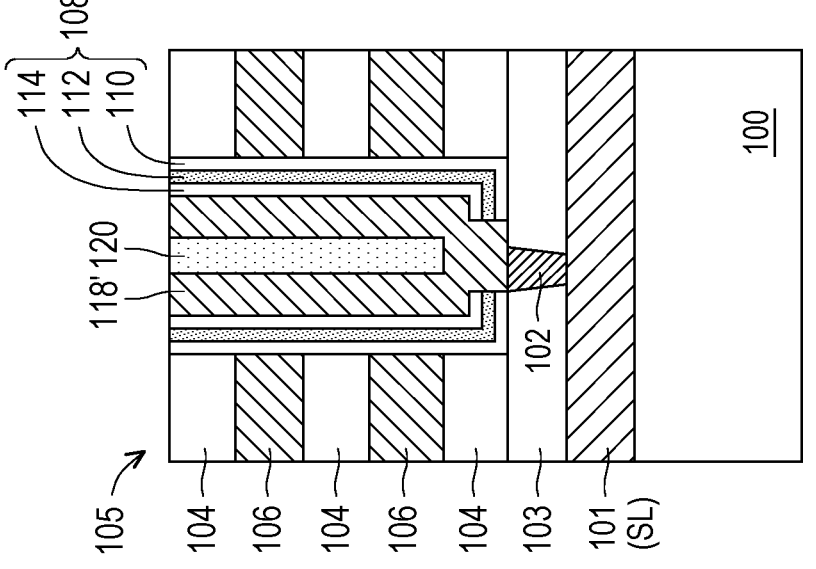
Figures 4A, 4B, 4C:
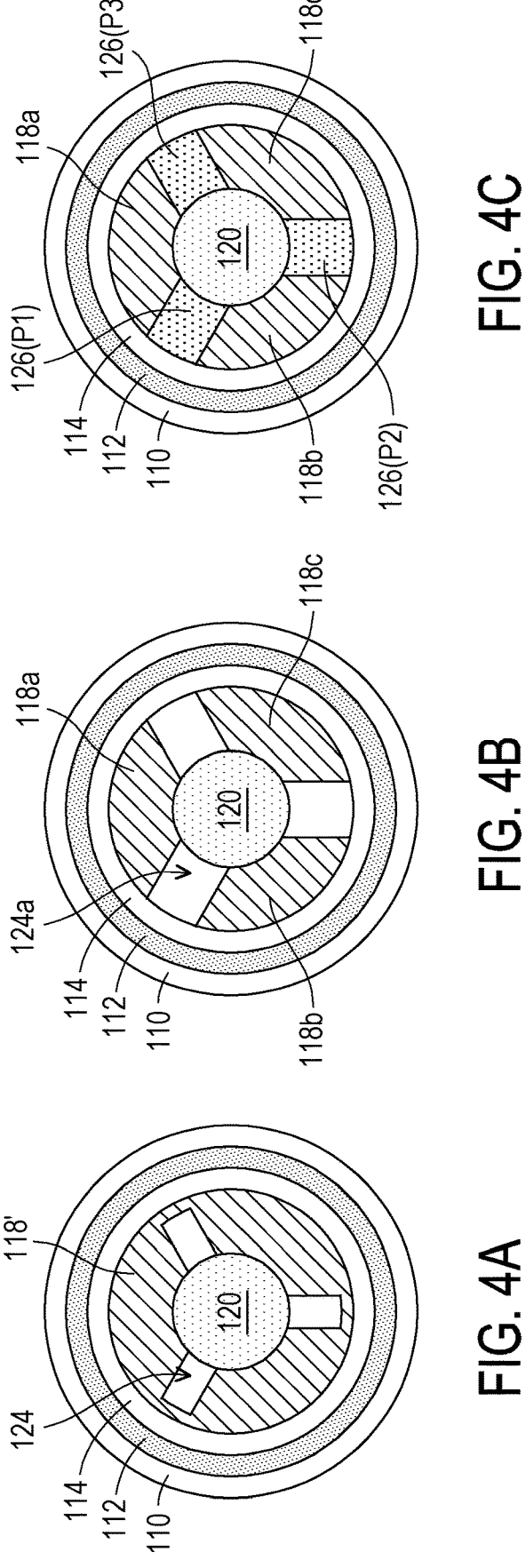
FIG. 4A to FIG. 4C are schematic top views taken along line II-II' of FIG. 3B to FIG. 3D.

Referring to FIG. 1D and FIG. 3A, the charge storage structure 108 is formed in the hole 107 of the stack structure 105 according to the above-mentioned method. Next, a semiconducting layer 118' is formed on the charge storage structure 108. In this embodiment, the semiconducting layer 118' is a conformal layer, and does not fill up the hole 107. After that, a filling pillar 120 is formed in the remaining space of the hole 107. The material of filling pillar 120 is silicon nitride, for example. The method of forming the filling pillar 120 is, for example, filling the filling material into the remaining space of the hole 107, and then performing an etch-back process or a chemical mechanical polishing process to remove the filling material above the stack structure 105.

Referring to FIG. 3B and FIG. 4A, a patterned hard mask layer 122 is formed on the stack structure 105. After that, a first stage etching process is performed to etch the semiconducting layer 118' to form an opening 124. The opening 124 includes three spaces separated by the filling pillar 120. The first stage of the etching process is, for example, a dry etching process.

Figure 3D:
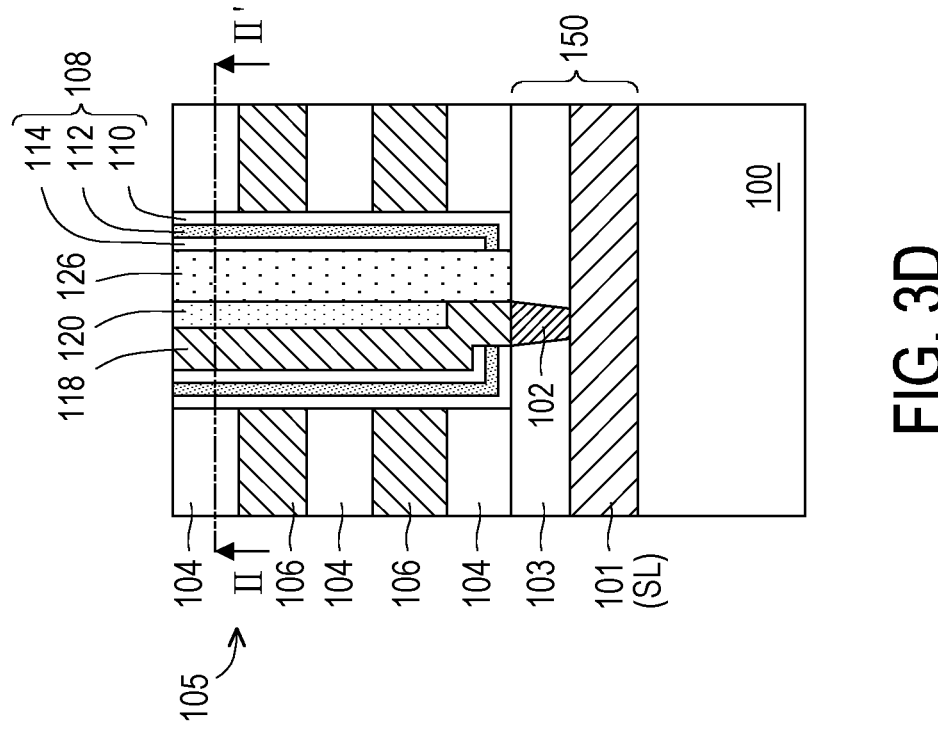
Figure 3C:
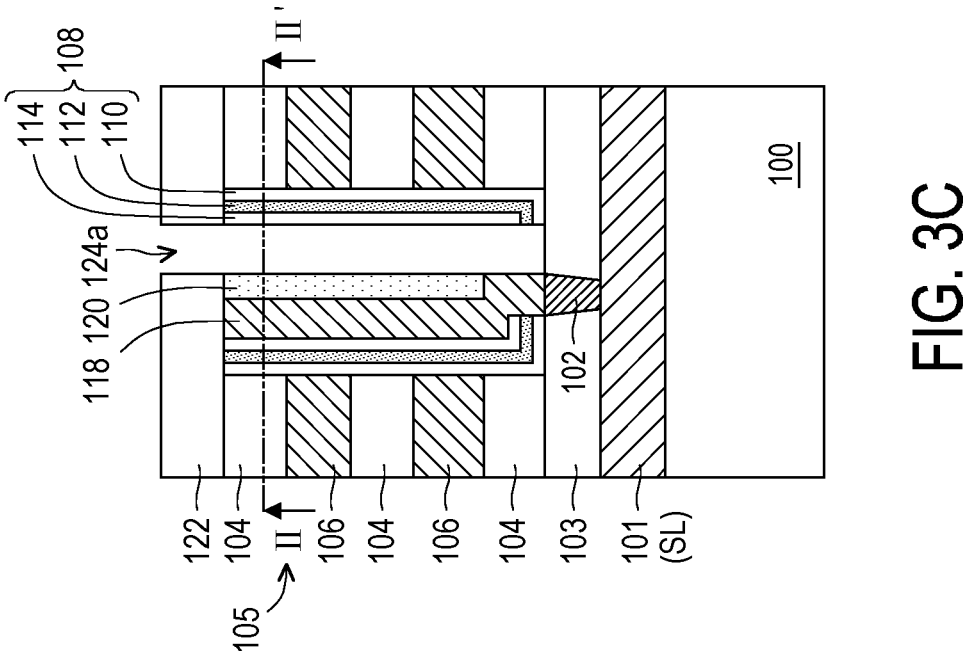

Referring to FIG. 3C and FIG. 4B, a second stage etching process is performed, so that the opening 124 expand to form an opening 124a. The second stage etching process is, for example, a wet etching process. Sidewalls of the tunneling layer 114 are exposed in the opening 124a, and the conductive layer 118' is divided to form channel pillars 118. In some embodiments, the channel pillars 118 within in the tunneling layer 114 may include channel pillars 118a, 118b, and 118c separated from each other. The channel pillars 118a, 118b, and 118c are respectively electrically connected to the plugs 102a. 102b, and 102c. From a top view, the shape of the channel pillar 118 is, for example, a portion of an annulus.

Figures 3E, 3F:
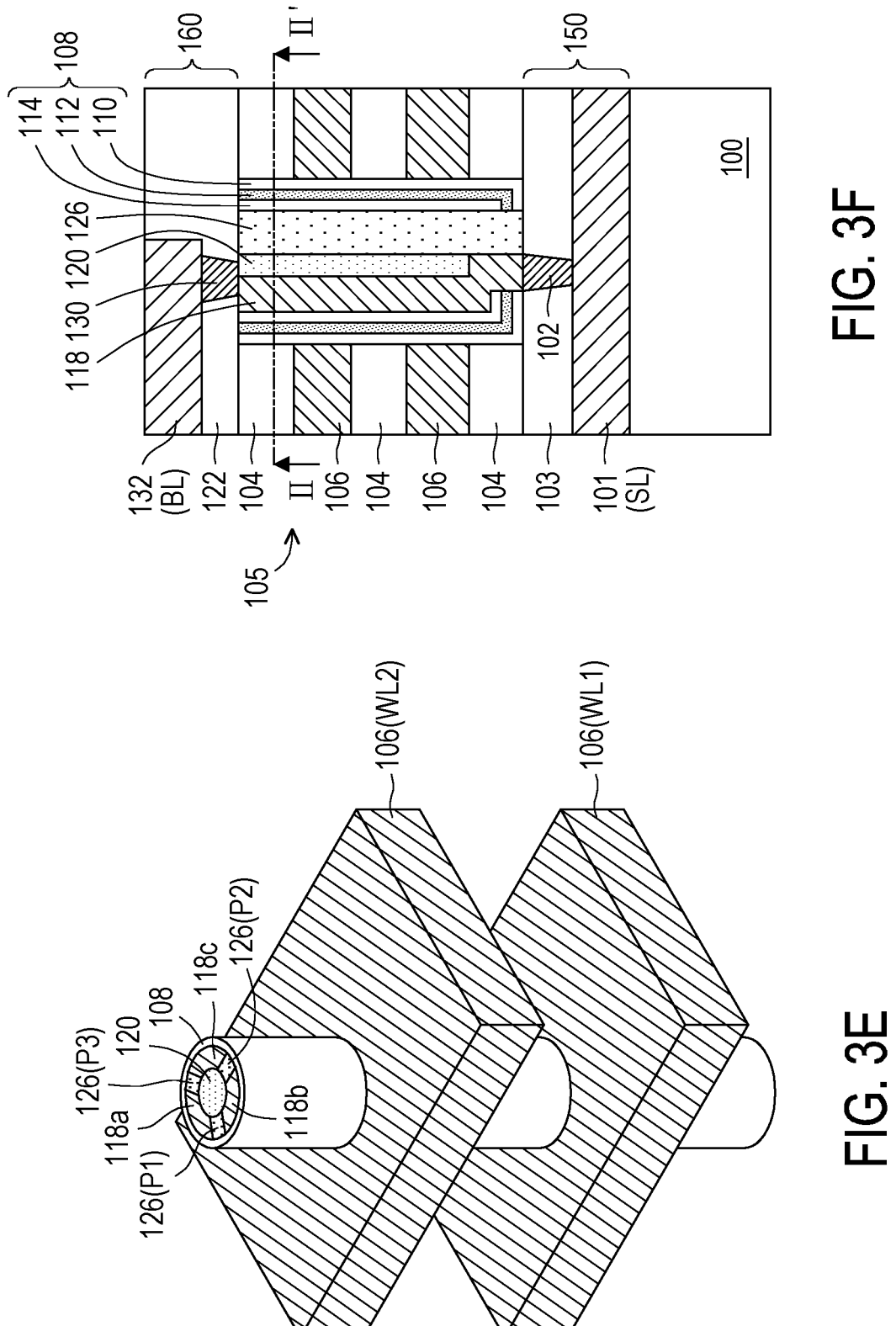

Referring to FIG. 3D, FIG. 3E and FIG. 4C, the mask layer 122 is removed. An insulating pillar 126 are formed in the openings 124a. The insulating pillar 126 includes three portions P1, P2, and P3 surrounding the filling pillar 120 as shown in FIG. 3E and FIG. 4C. Each portion (e.g., P1, P2, or P3) of the insulating pillar 126 contacts the charge storage structure 108, and the channel pillars 118a, 118b, and 118c are electrically isolated from each other by the insulating pillar 126 and the filling pillar 120. The material of the insulating pillar 126 is silicon oxide, for example.

Figure 3G:
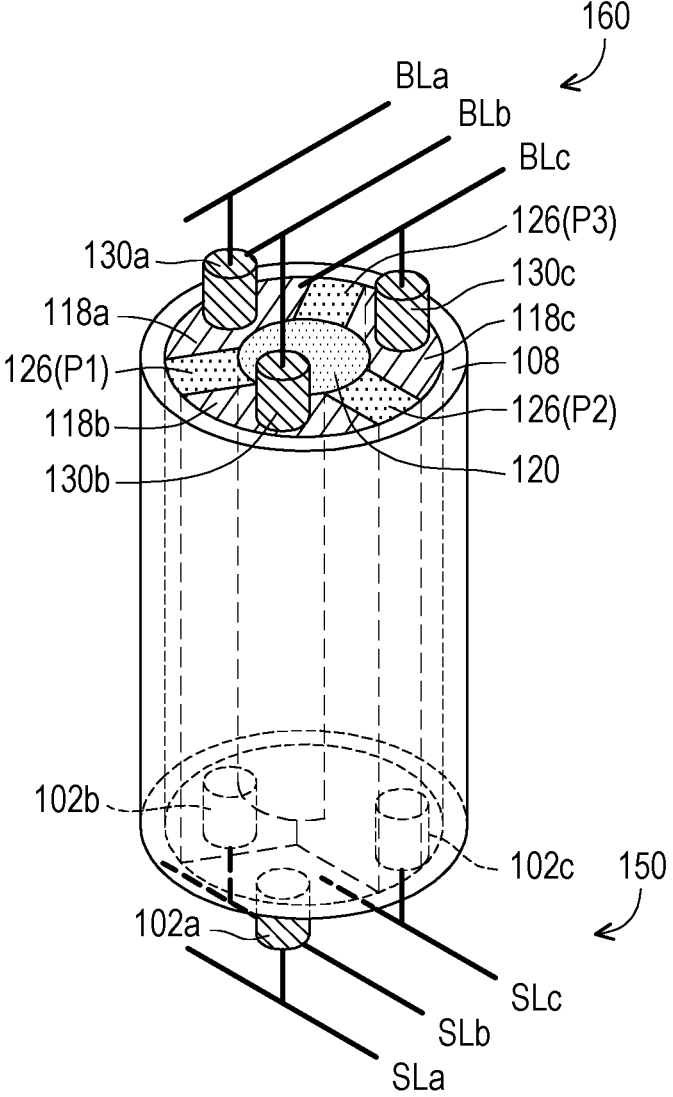

Referring to FIG. 3F and FIG. 3G, an interconnect structure 160 is formed on the stack structure 105.

FIG. 5A to FIG. 5J are cross-sectional schematic views and schematic perspective views illustrating intermediate stages in a manufacturing method of a three dimensional flash memory device with a gate-last process according to another embodiment of the present disclosure. FIG. 6A to FIG. 6D are schematic top views illustrating intermediate stages in a fabricating method of a three dimensional flash memory device according to another embodiment of the present disclosure.

Figure 5B:
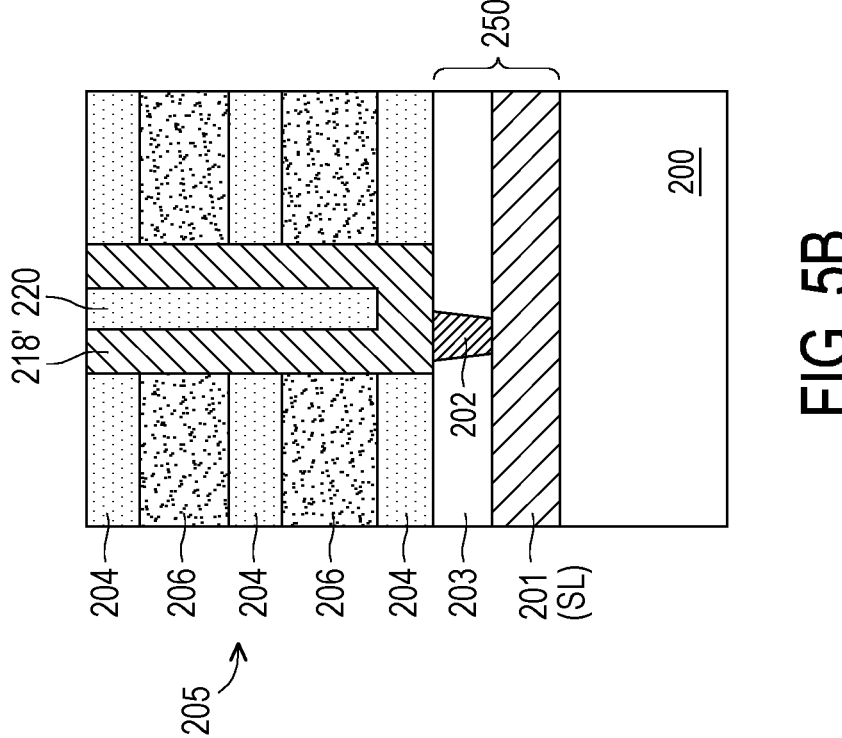
FIG. 5A to FIG. 5J are cross-sectional schematic views and schematic perspective views illustrating intermediate stages in a manufacturing method of a three dimensional flash memory device with a gate-last process according to another embodiment of the present disclosure.
Figure 5A:
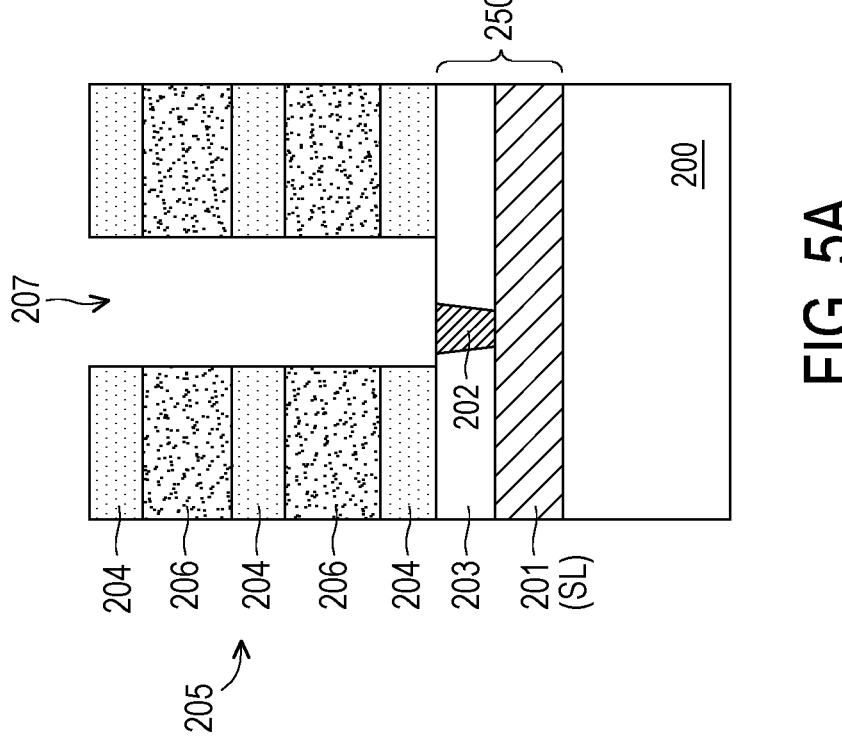

Referring to FIG. 5A, a substrate 200 is provided. The substrate 200 may be a semiconductor substrate, such as a silicon-containing substrate. The substrate 200 may further include a device layer (not shown) on the semiconductor substrate and an interconnect structure 250 on the device layer. The device layer may be the same as or different from those described in the above embodiment, and will not be described here.

Figure 5D:
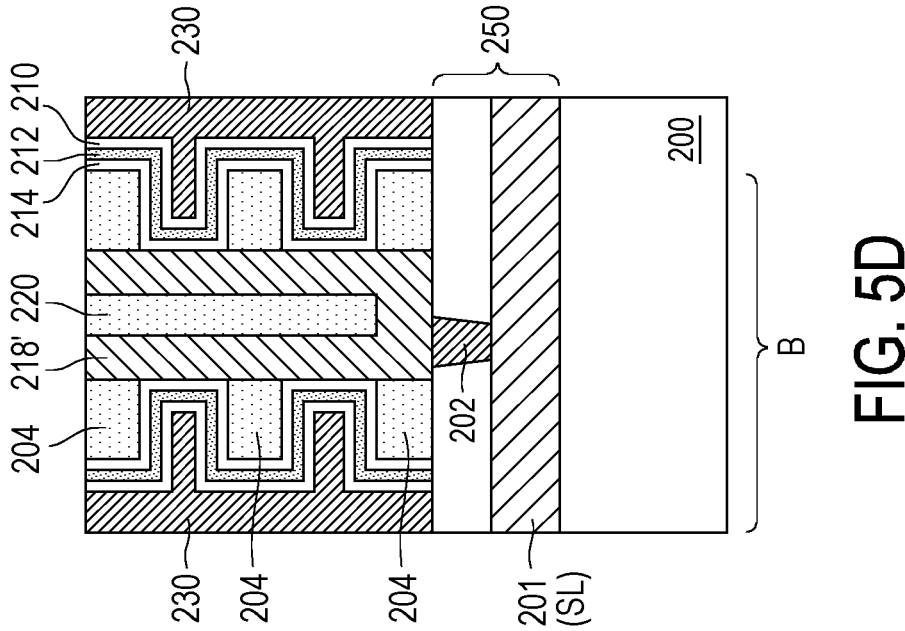
Figure 5C:
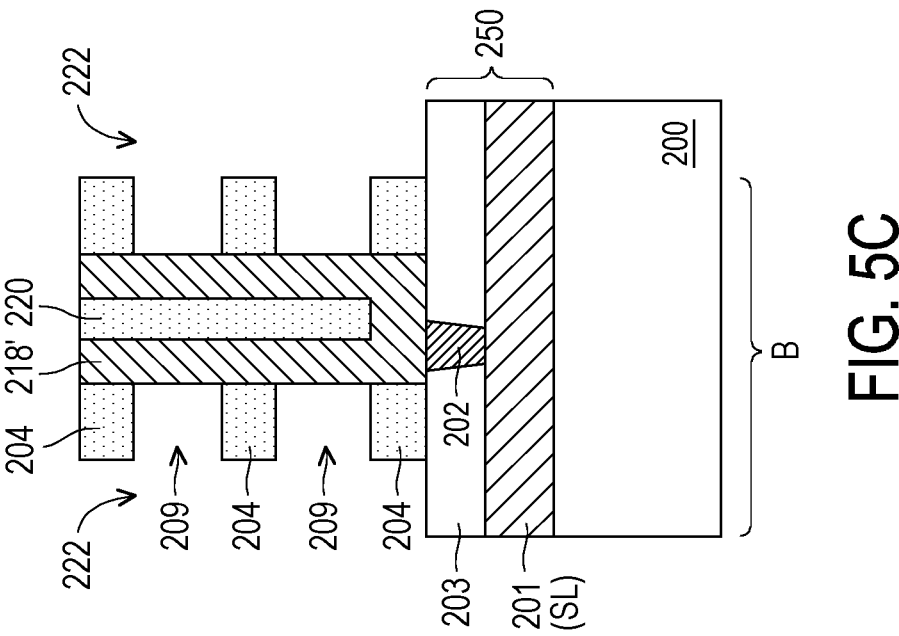
Figure 5F:
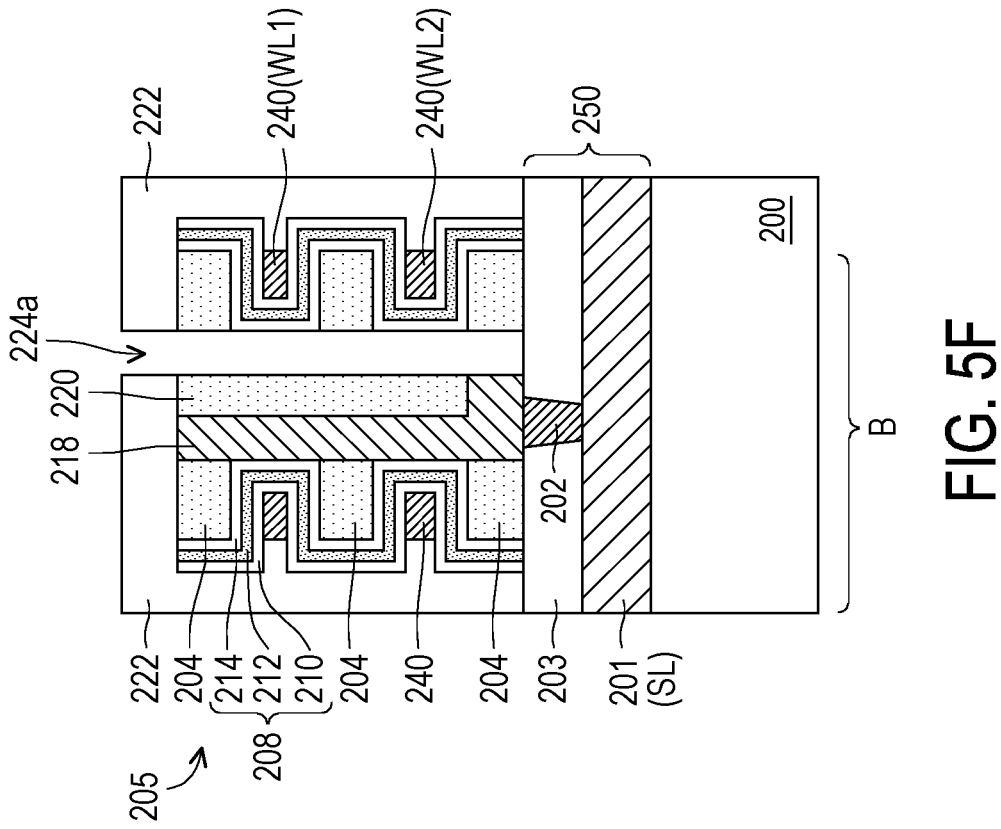
Figure 5E:
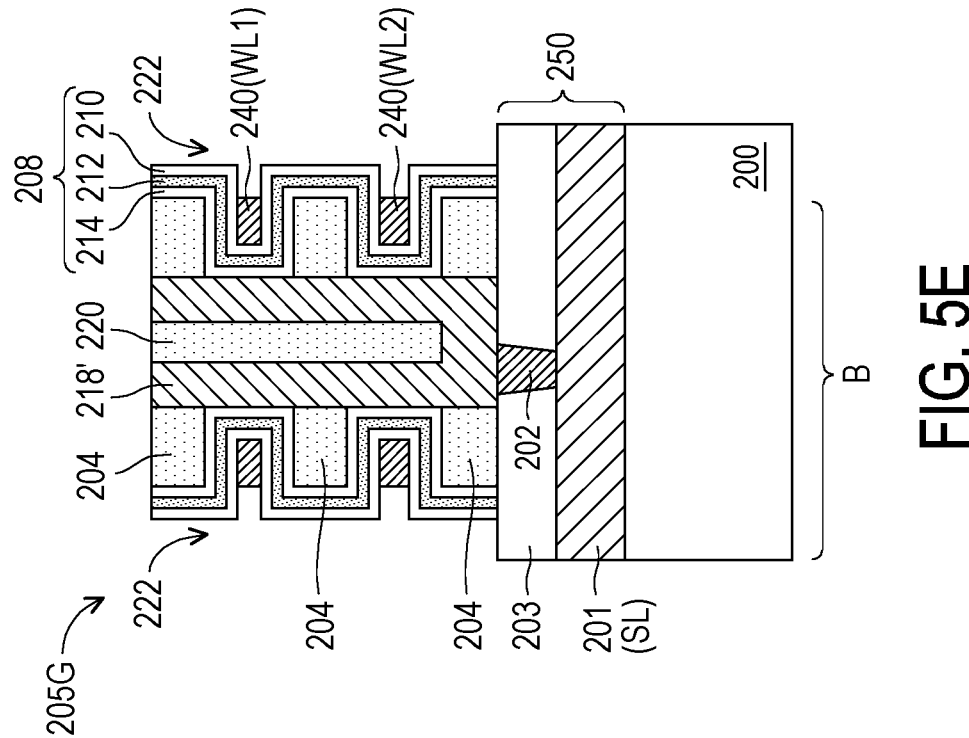
Figure 5H:
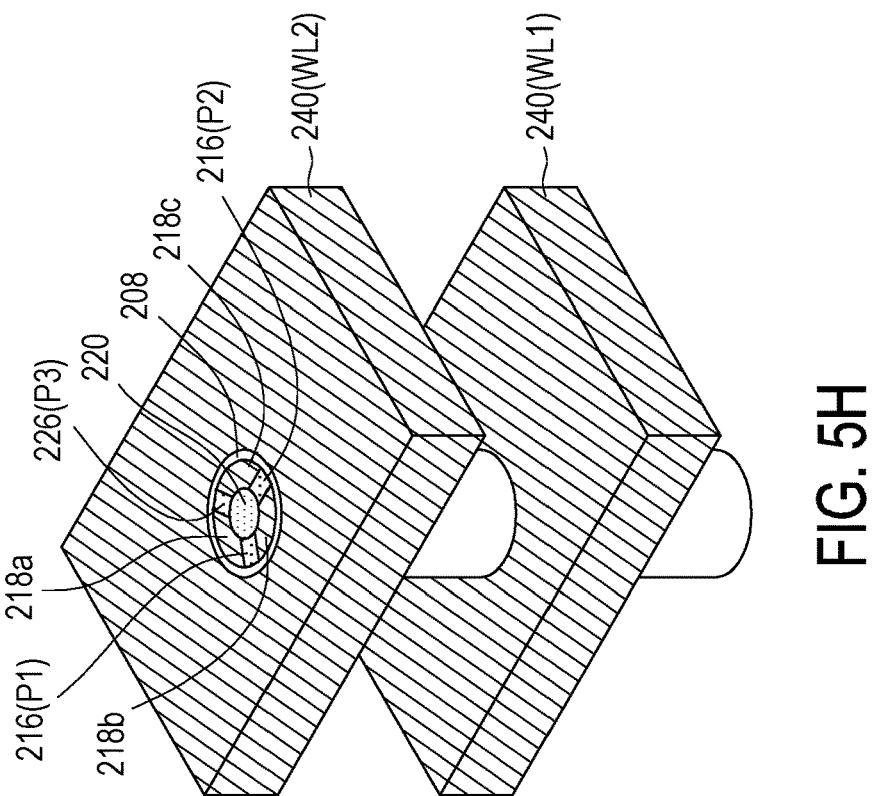
Figure 5G:
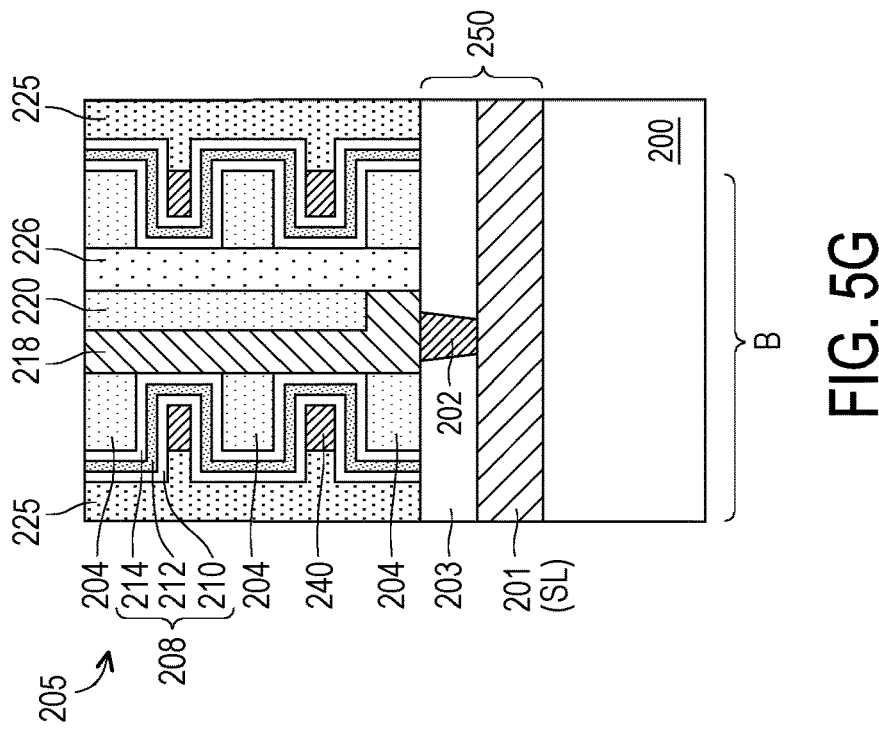
Figures 5I, 5J:
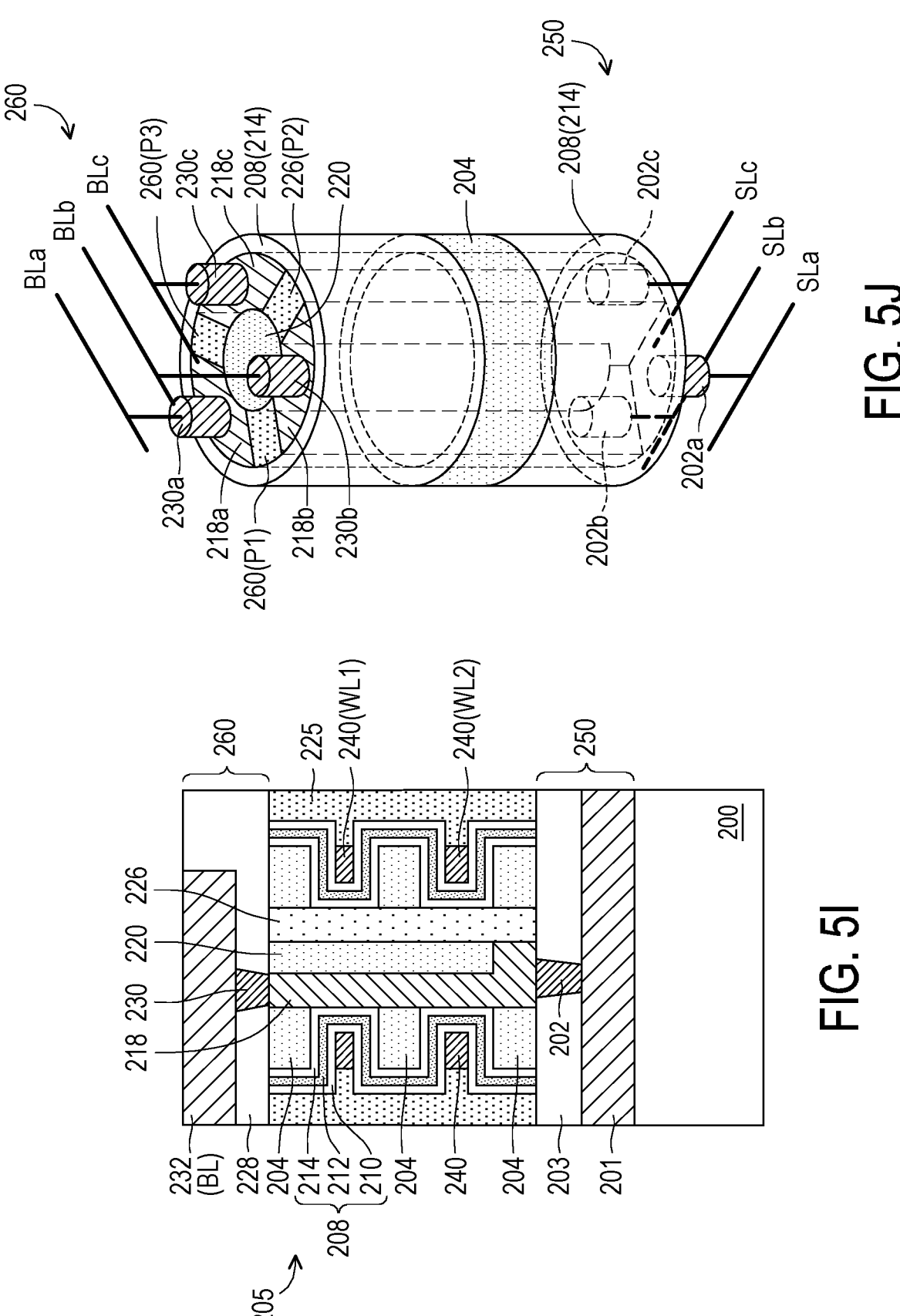

Referring to FIG. 5A and FIG. 5J, the interconnect structure 250 may include conductive lines 201, a dielectric layer 203, plugs 202, etc., but is not limited thereto. The conductive lines 201 may be used as source lines SL. In some embodiments, the source lines SL may include source lines SLa, SLb, and SLc, as shown in FIG. 5J. The plugs 202 may include plugs 202a, 202b, and 202c, which are electrically connected to source lines SLa, SLb. and SLc, respectively, as shown in FIG. 5J. The materials of the conductive lines 201, the dielectric layer 203, and the plugs 202 may be the same as or different from the materials of the conductive lines 101, the dielectric layer 103, and the plugs 102.

Referring to FIG. 5A, a stack structure 205 is formed on the substrate 200. The stack structure 205 includes a plurality of first material layers 204 and a plurality of second material layers 206 alternately stacked each other. The first material layer 204 may be an insulating layer, such as silicon oxide. The second material layer 206 may be an insulating layer, such as silicon nitride. The second material layer 206 may be used as a sacrificial layer. In this embodiment, the bottom layer and the top layer of the stack structure 205 are both the first material layer 204, but the present disclosure is not limited to this. In addition, in this embodiment, three layers of the first material layer 204 and two layers of the second material layer 206 are used for illustration, however, the present disclosure is not limited thereto.

Referring to FIG. 5A, next, a patterning process is performed to remove part of the stack structure 205 to form one or more holes 207 passing through the stack structure 205. The shape and the forming method of the hole 207 may be the same as or different from the shape and the forming method of the hole 107.

Referring to FIG. 5B, a semiconducting layer (or referred to as a channel layer) 218' is formed in the hole 207. In this embodiment, the semiconducting layer 218' does not fill up the hole 207. After that, a filling pillar 220 is formed in the remaining space of the hole 207. The material and forming method of filling pillar 220 may be the same as or different from the material and forming method of filling pillar 120.

Referring to FIG. 5C, a lithography and etching process is performed to form slit trenches 222 in the stack structure 205. The slit trenches 222 divide the stack structure 205 into multiple blocks B, such as blocks B1, B2, and B3, as shown in FIG. 6A to FIG. 6D. Sidewalls of the first material layers 204 and the second material layers 206 of each block B are exposed in the slit trenches 222. Next, an etchant is used to remove the second material layer 206 of the stack structure 205. As a result, horizontal openings 209 are formed, and the first material layers 204 and the semiconducting layer 218' are exposed in the horizontal openings 209.

Referring to FIG. 5D, a tunneling layer 214, a storage layer 212, a blocking layer 210 and a gate conductive layer 240 are formed in the slit trenches 222 and horizontal openings 209. The tunneling layer 214, the storage layer 212, and the blocking layer 210 are, for example, conformal layers, which may be formed by a thermal oxidation method or a chemical vapor deposition method. The materials of the tunneling layer 214, the storage layer 212, and the blocking layer 210 are, for example, silicon oxide, silicon nitride, and silicon oxide. The gate conductive layer 240 is, for example, tungsten.

Referring to FIG. 5E, an etch-back process is performed to remove the gate conductive layer 240 in the slit trenches 222 in some embodiments. The tunneling layer 214, the storage layer 212, and the blocking layer 210 remaining in the horizontal openings 209 form a charge storage structure 208. The gate conductive layers 240 may be used as word lines WL1 and WL2. The conductive layers 240 and the first material layers 204 form a gate stack structure 205G. In other embodiments, the etch-back process is performed to remove the gate conductive layer 240, the tunneling layer 214, the storage layer 212, and the blocking layer 210 in the slit trenches 222 (not shown).

Referring to FIG. 5F and FIG. 5J, a mask layer 222 is formed on the substrate 200. The mask layer 222 may be a patterned photoresist layer. Then, using the mask layer 222 as a mask, an etching process is performed to etch semiconducting layer 218' to form the opening 224a. The etching process for forming the opening 224a may the same as or different from the etching process for forming the opening 124a. The tunneling layer 114 is exposed in the opening 124a. The semiconducting layer 218' is divided into channel pillars 218. In some embodiments, the channel pillars 218 within in the tunneling layer 214 may include channel pillars 218a, 218b, and 218c separated from each other. The channel pillars 218a, 218b, and 218c are respectively electrically connected to the plugs 202a, 202b, and 202c below as shown in FIG. 5J.

Referring to FIG. 5G and FIG. 5H, the mask layer 222 is removed. An insulating pillar 226 is formed in opening 224a, and slit structures 225 are formed in the slit trench 222. The insulating pillar 226 may include three portions P1, P2, and P3 separated by filling pillar 220 as shown in FIG. 5H and FIG. 5J. The insulating pillar 226 contacts the charge storage structure 208, and the channel pillars 218a, 218b, and 218c are electrically isolated from each other. The material of the insulating pillar 226 and the slit structures 225 are silicon oxide, for example.

Referring to FIG. 5I and FIG. 5J, an interconnect structure 260 is formed on the gate stack structure 205G. The interconnect structure 260 may include a dielectric layer 228, plugs 230 and conductive lines 232 and the like, but not limited thereto.

Referring to FIG. 5I and FIG. 5J, in some embodiments, the plugs 230 includes plugs 230a, 230b, and 230c. The plugs 230a, 230b, and 230c are electrically connected to the source lines BLa, BLb, and BLc, respectively, as shown in FIG. 5J. The conductive lines 232 may be used as bit lines BL, which are formed in the dielectric layer 228, and are electrically connected to the plugs 230. The bit line BL may include bit line BLa, BLb, and BLc, which are electrically connected to plugs 230a, 230b, and 230c, respectively, as shown in FIG. 5J.

Referring to FIG. 5H, FIG. 5I, FIG. 5J, the plurality of gate conductive layers 240 as the word lines WL1 and WL2 are stacked on the substrate 200 and electrically isolated each other by the plurality of first material layers 204. The plurality of channel pillars 218, for example, three channel pillars 218a, 218b, and 218c extend through the plurality of gate conductive layers 240. The charge storage structure 208 is located between the channel pillars 218a, 218b, 218c and the plurality of gate conductive layers 240. The channel pillars 218a, 218b, and 218c are respectively electrically connected to the source lines SLa, SLb, and SLc via the plugs 202a, 202b, and 202c. The channel pillars 218a, 218b, and 218c are electrically connected to the bit lines BLa, BLb, and BLc via the plugs 230a, 230b, and 230c, respectively.

Figures 6A, 6B:
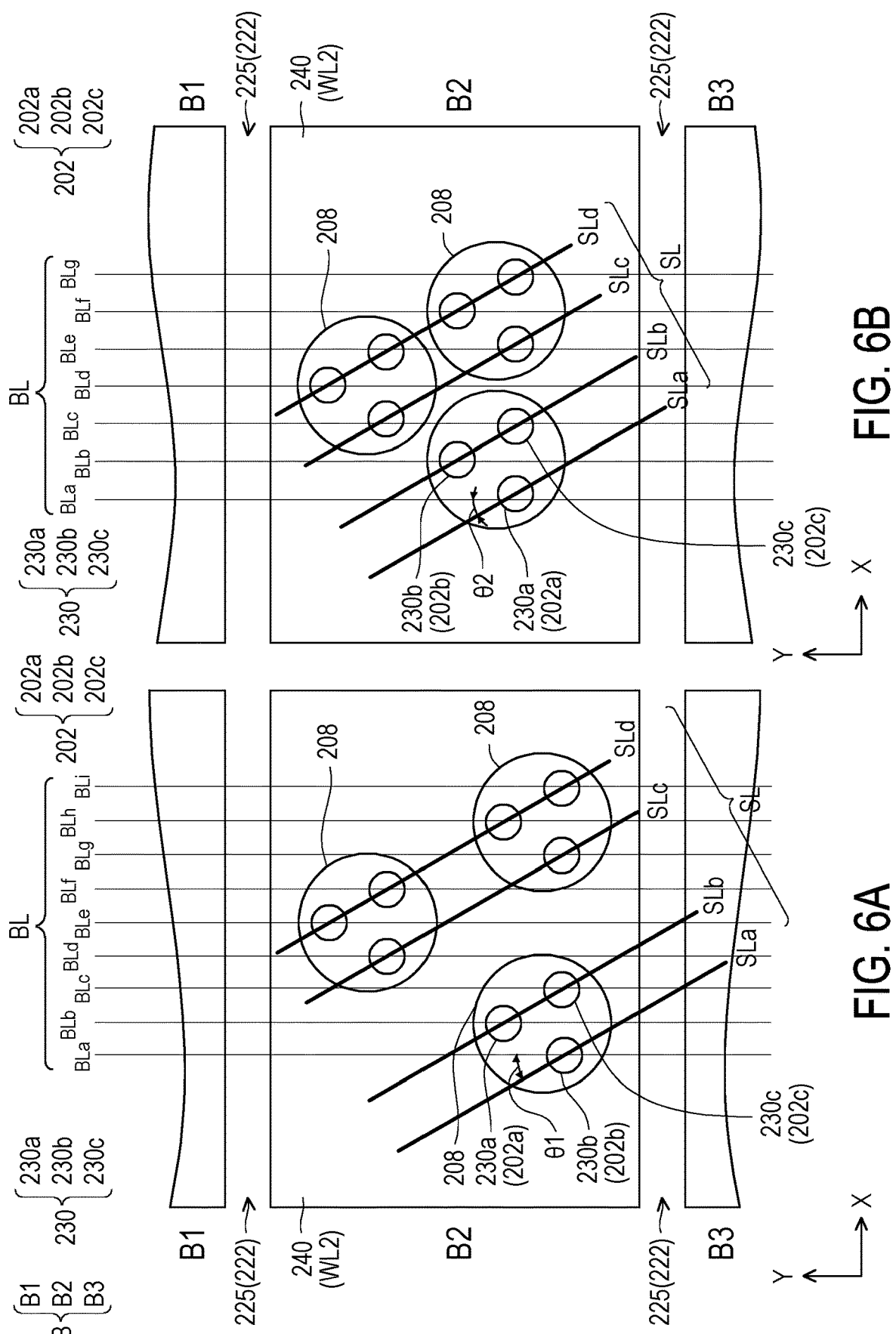
FIG. 6A to FIG. 6D are schematic top views illustrating intermediate stages in a manufacturing method of a three dimensional flash memory device according to another embodiment of the present disclosure.
Figures 6C, 6D:
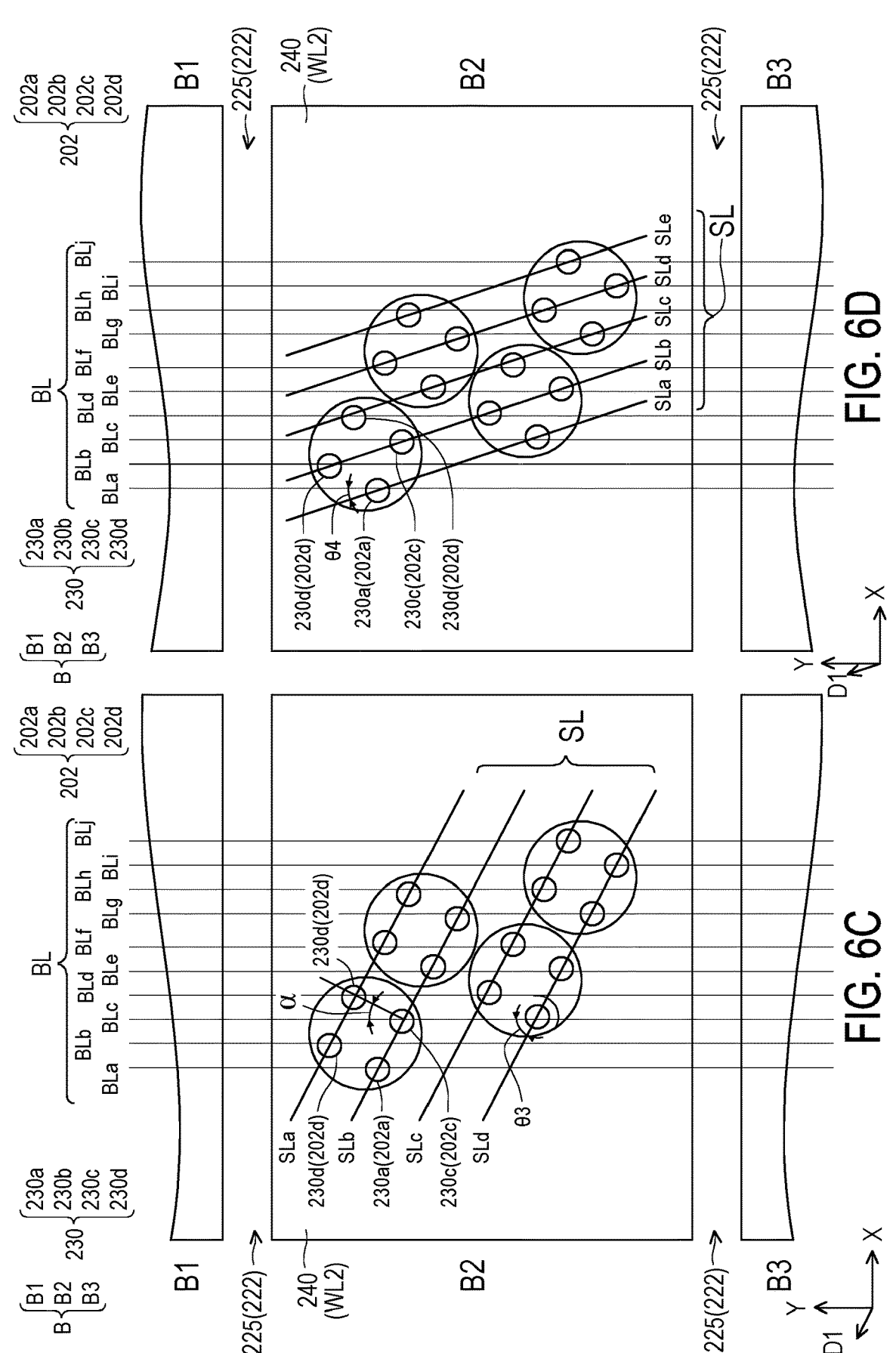

Referring to FIG. 5J, FIG. 6A and FIG. 6B, in some embodiments, there are three plugs 230 (e.g., 230a, 230b, and 230c) within the area enclosed by the charge storage structure 208, which electrically connect the three channel pillars 218 (e.g., 218a, 218b, and 218c). Referring to FIG. 6C and FIG. 6D, in some embodiments, In some embodiments, there are four plugs 230 (e.g., 230a, 230b, 230c, and 230d) within the area enclosed by the charge storage structure 208, which electrically connect the four channel pillars (not shown). In some embodiments, the included angle α between the line connecting the centers of the plugs 230c and 230d and the Y axis is 26.565 degrees. However, the embodiment of the present disclosure is not limited to there.

Referring to FIGS. 6A to 6D, in the embodiment of the present disclosure, the included angles θ1, and θ2, θ3, and θ4 between the extending direction of the bit line BL and the extending direction of the source line SL are acute angles. Referring to FIG. 6A to FIG. 6D, for example, the bit line BLa, BLb, . . . BLj extending along the Y-axis direction, and the source line SLa, SLb, SLc, SLd, SLe extending along an D1 direction extending in a direction D1. The included angles θ1, and θ2, θ3, and θ4 between the D1 direction and the Y direction are acute angles.

Referring to FIG. 6A, in some embodiments, the pitch between the charge storage structures 208 is larger, with looser packing, and each bit line BL (e.g., BLa, BLb, . . . , or BLi) in the same block (e.g., B2) overlaps only one plug 230 (e.g., 230a, 230b or 230c). Referring to FIG. 6B to FIG. 6D, in other some embodiments, the pitch between the charge storage structures 208 is smaller, with tighter packing, and each bit line BL (e.g., BLa, BLb, . . . , or BLj) in the same block (e.g., B2) overlaps one or more plugs 230 (e.g., 230a, 230b and/or 230c).

Referring to FIG. 6A to FIG. 6D, in some embodiments, the source line SL in the same block (e.g., B2) may overlap with one, two, or more plugs 202 within the same charge storage structure 208. The source line SL in the same block (e.g., B2) may overlap with one, two, or more plugs 202 in different charge storage structures 208.

In the above embodiments, the channel pillar 118a, 118b, 118c or 218a, 218b, 218c are all within the inner sidewall of the charge storage structure 108 or 208, but the present disclosure is not limited thereto.

In other embodiments, the multiple pillars may be used with other memory types besides charge storage. For example, the charge storage structure may be replaced by a ferroelectric memory structure.

Figure 7B:
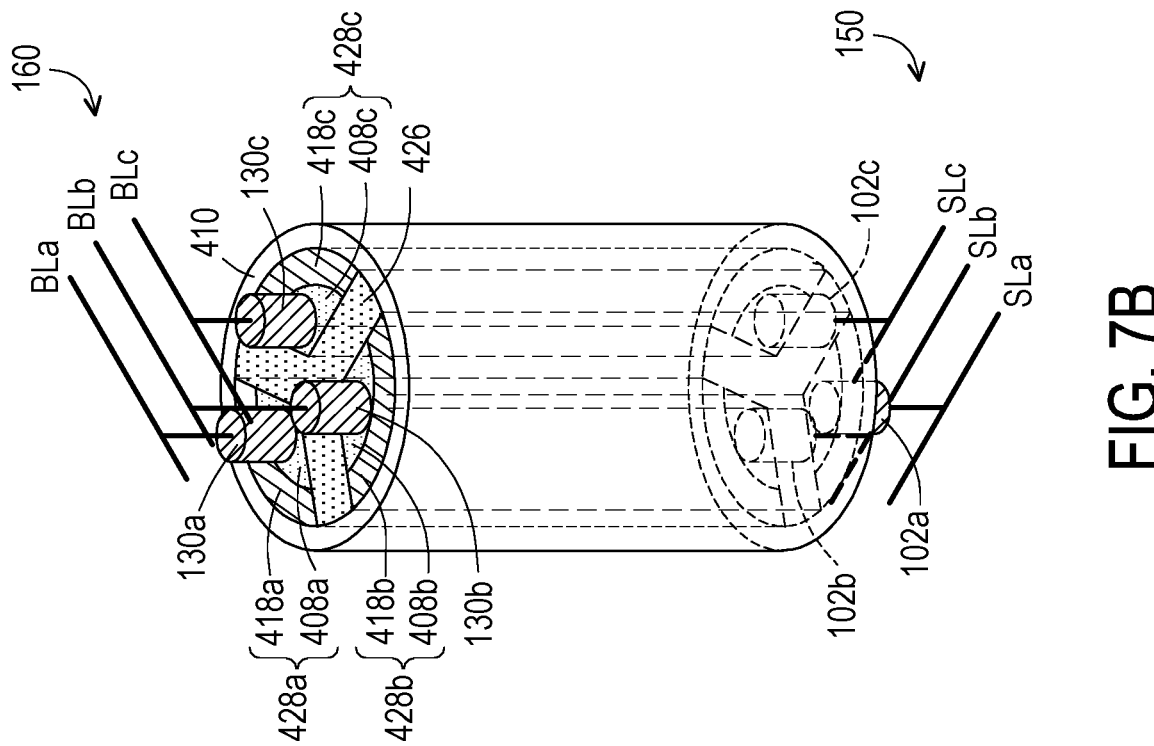
FIG. 7A to FIG. 7B are a cross-sectional schematic view and a schematic perspective view illustrating intermediate stages in a manufacturing method of a three dimensional phase change memory device.
Figure 7A:
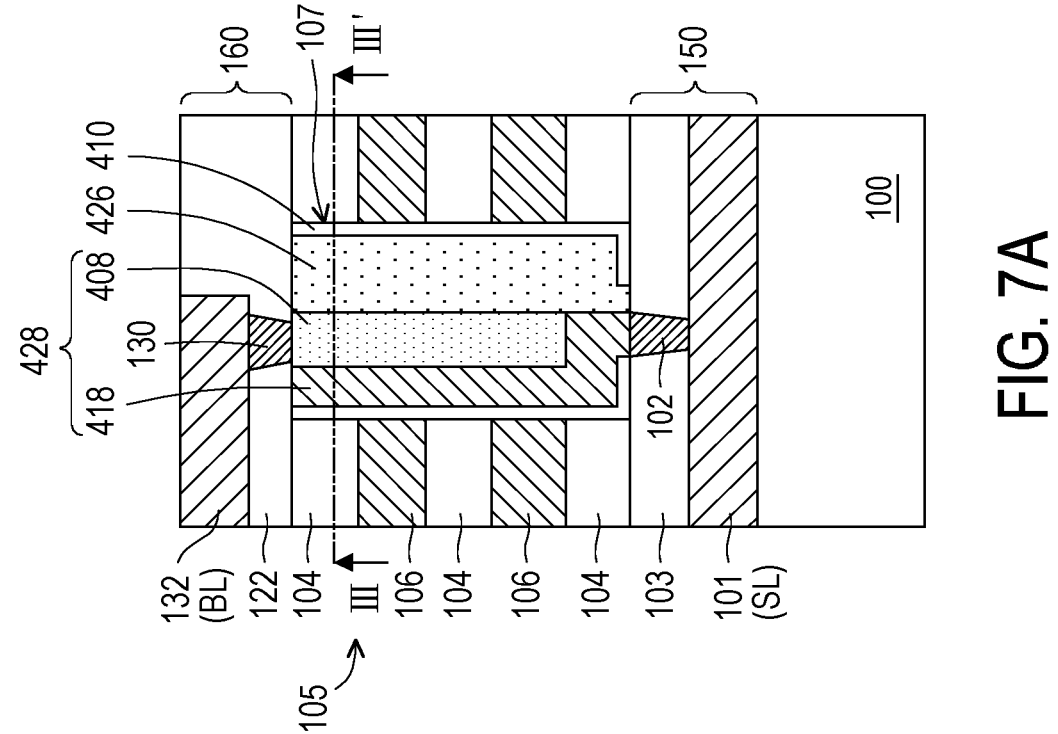

FIG. 7A to FIG. 7B are a cross-sectional schematic view and a schematic perspective view illustrating intermediate stages in a manufacturing method of a three dimensional phase change memory device.

In another alternative embodiment, shown in FIGS. 7A and 7B, pillars 428 (e.g., 428a. 428b, and 428c) are divided and isolated by an insulating pillar 426. Each of the divided and isolated pillars 428 (e.g., 428a, 428b, or 428c) comprises an outer channel region 418 (e.g., 418a. 418b, and 418c), and an inner phase change memory region 408 (e.g., 408a, 408b, and 408c). The pillars 428 (e.g., 428a. 428b, and 428c) fill a hole 107 encircled by a gate oxide layer 410 which couples to the surrounding word lines WL1 and WL2.

FIG. 8A to FIG. 8D are schematic top views illustrating intermediate stages in a manufacturing method of a three dimensional phase change memory device with a gate-first process according to an embodiment of the present disclosure. FIG. 8A to FIG. 8D are schematic top views taken along line III-III' of FIG. 7A.

Figure 8B:
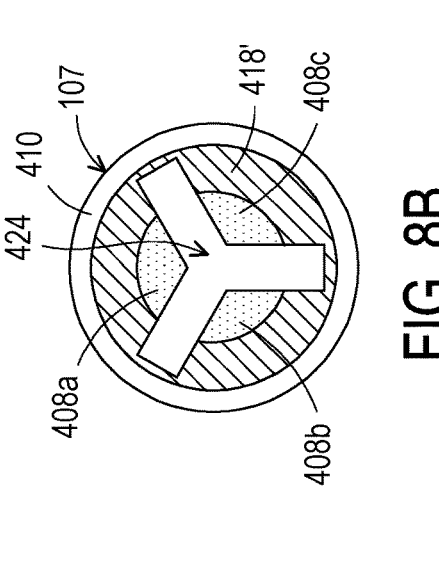
FIG. 8A to FIG. 8D are schematic top views illustrating intermediate stages in a manufacturing method of a three dimensional phase change memory device with a gate-first process according to an embodiment of the present disclosure.
Figure 8D:
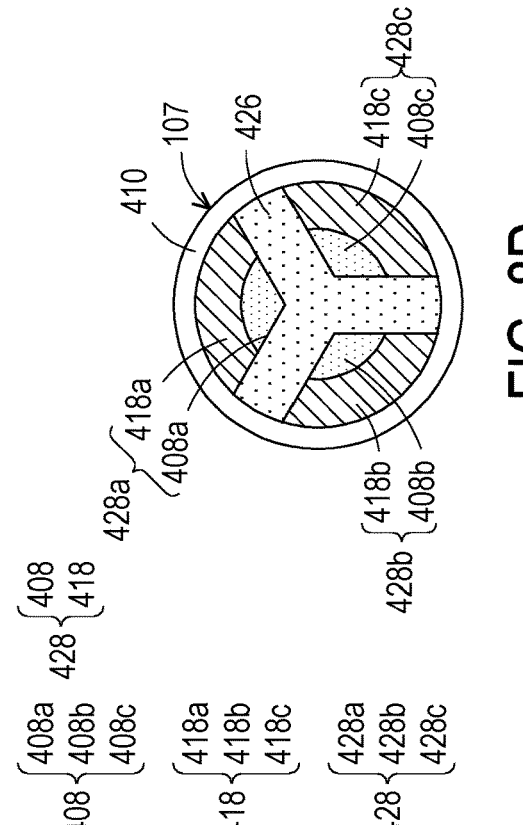
Figure 8A:
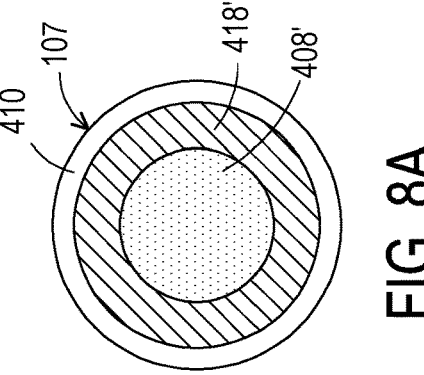

Referring to FIG. 8A, a gate dielectric layer 410 is formed in a hole 107 in a stack structure 105 (shown in FIG. 7A) by a method similar to the charge storage structure 108 (shown in FIG. 1B to FIG. 1D). A semiconducting layer (or referred to as a channel layer) 418' and a phase change layer 408' are formed in the hole 107. The gate dielectric layer 410 is, for example, silicon oxide, or a high dielectric constant material having a dielectric constant greater than or equal to 7, or a ferroelectric material such as aluminum oxide ($Al_2O_3$), hafnium oxide ($HfO_2$), lanthanum oxide ($La_2O_5$), transition metal oxide, lanthanide oxide, or combinations thereof. The semiconducting layer 418' is undoped polysilicon, for example. The phase change layer 408' may include a chalcogenide material such as an indium (In)-antimony (Sb)-tellurium (Te) (IST) material.

Referring to FIG. 8B, a patterned hard mask (not shown) is formed over the stack structure 105 (shown in FIG. 7A). After that, the first stage etching process, for example, a dry etching process, is performed on the phase change layer 408' and the semiconducting layer 418' to form an opening 424. The opening 424 divides the phase change layer 408 into phase change memory region 408 (e.g., 408a, 408b, and 408c).

Figure 8C:
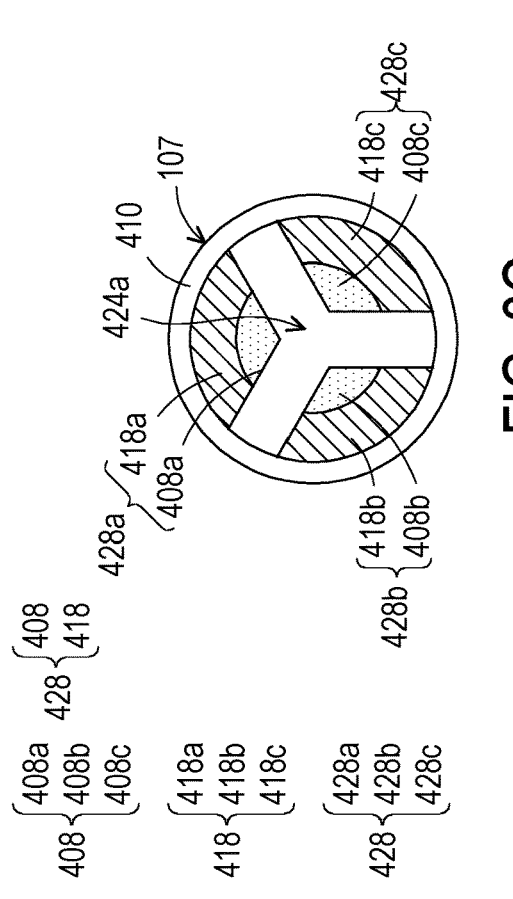

Referring to FIG. 8C and FIG. 7A, a second-stage etching process, for example, a wet etching process, is performed to expand the opening 424 into the opening 424a. The opening 424a divides the semiconducting layer 418' and the phase change layer 408 into pillars 428 (e.g., pillars 428a. 428b, and 428c). The pillars 428 (e.g., 428a, 428b, and 428c) each includes an outer channel region 418 (e.g., 418a. 418b, and 418c) and an inner phase change memory region 408 (e.g., 408a. 408b, and 408c).

Referring to FIG. 8D and FIG. 7A, the opening 424a is filled with an insulating pillar 426 to isolate the pillars 428 (e.g., 428a, 428b, and 428c).

Referring to FIG. 7B, an interconnect structure 160 is formed on the stack structure 105 according to the above-mentioned method.

Figure 9:
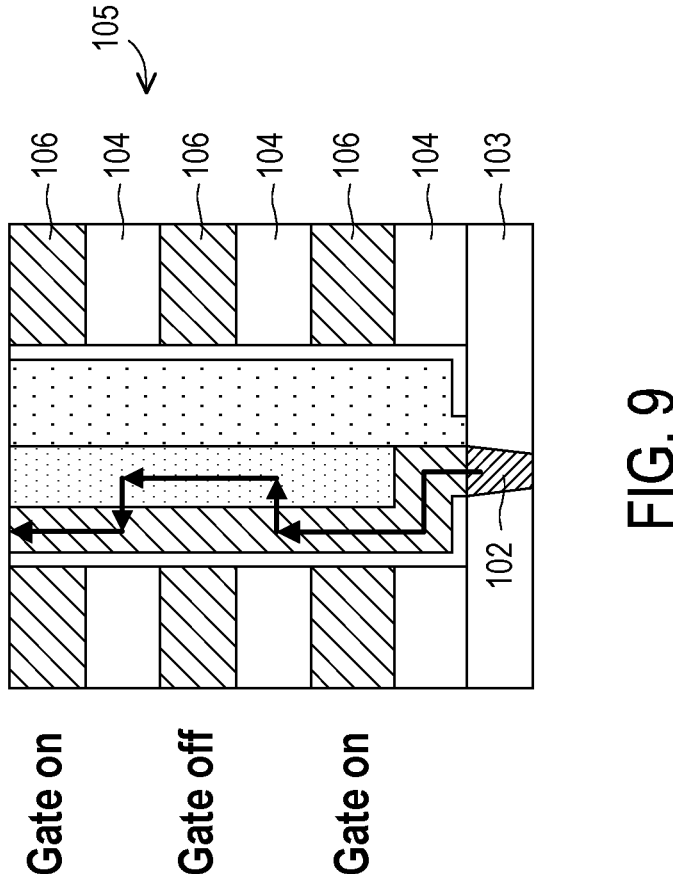
FIG. 9 is a schematic top view illustrating an operation of a three dimensional phase change memory device.

FIG. 9 is a schematic top view illustrating an operation of a three dimensional phase change memory device.

Referring to FIG. 9, the unselected word lines are biased to have the channel conducting, while the selected word line is biased to have the channel non-conducting. When conducting, the channel should be a much lower resistance path than the phase change region beside it, therefore drawing all or nearly all the current. On the other hand, when non-conducting, the current flow through the phase change region at the same height as the word line, for the desired read or write operation.

In view of above, in many embodiments of the present disclosure, each charge storage structure or each phase change memory region is coupled to one of the three channel pillars, so that the memory cells may be more closely arranged, thereby increasing the number of memory cells per chip area and increase the density of memory cells.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a gate stack structure, disposed above a substrate, wherein the gate stack structure includes a plurality of gate layers and a plurality of insulating layers vertically stacked alternately;
at least three channel pillars, extending through the gate stack structure, wherein the at least three channel pillars are electrically isolated from one another;
a charge storage structure, disposed within each of the plurality of gate layers surrounding at least three channel pillars;
at least three source lines, disposed below the gate stack structure, and electrically connected to the at least three channel pillars; and
at least three bit lines, disposed above the gate stack structure, and electrically connected to the at least three channel pillars,
wherein the at least three bit lines extending in a first direction, and the at least three source lines extending in a second direction, and an included angle between the first direction and the second direction is an acute angle.

2. The memory device of claim 1, further comprising an insulating pillar, disposed among the at least three channel pillars.

3. The memory device of claim 2, wherein from a top view, the insulating pillar has a Y-shape.

4. The memory device of claim 1, wherein from a top view, the at least three channel pillars have a circular sector shape or a portion of an annulus shape.

5. The memory device of claim 1, further comprising at least three spacers around the least three channel pillars.

6. The memory device of claim 1, wherein an outer region of each channel pillar is a semiconducting channel region, and an inner region of each channel pillar is a phase change memory region and the material of the charge storage structure is dielectric.

7. The memory device of claim 6, further comprising an insulating pillar, disposed among the at least three channel pillars.

8. A method for manufacturing a memory device, comprising:

forming at least three source lines over a substrate;

forming a stack structure over the at least three source lines, where the stack structure includes a plurality of gate layers and a plurality of insulating layers stacked alternately each other;

forming a hole in the stack structure;

forming a charge storage structure on sidewalls of the hole;

forming a semiconducting layer in the hole;

patterning the semiconducting layer to form at least three channel pillars within the charge storage structure, wherein the at least three channel pillars connected to the at least three source lines;

forming an insulating pillar in a remaining space of the hole; and forming at least three bit lines over the gate stack structure, wherein the at least three bit lines are electrically connected to the at least three channel pillars.

9. The method of claim 8, wherein forming the semiconducting layer in the hole so that the hole is filled completely with the semiconducting layer.

10. The method of claim 9, wherein patterning the semiconducting layer and forming the insulating pillar comprising:

forming a first opening in the semiconducting layer, wherein the semiconducting layer is exposed in ends of the first opening;

forming a second opening by expanding the first opening, wherein the charge storage structure is exposed in ends of the second opening; and forming the insulating pillar in the second opening.

11. The method of claim 10, wherein from a top view, the first opening has a Y-shape.

12. The method of claim 10, wherein from a top view, the second opening has a Y-shape.

13. The method of claim 10, wherein the forming the first opening comprises a dry etching process, and forming a second opening comprises a wet etching process.

14. The method of claim 8, wherein forming the semiconducting layer in the hole so that the hole is not filled completely with the semiconducting layer, and the method further comprising forming insulating pillar in the hole.

15. The method of claim 14, wherein patterning the semiconducting layer and forming the insulating pillar comprising:

forming a first opening in the semiconducting layer, wherein the semiconducting layer and the filling pillar are exposed in ends of the first opening;

forming a second opening by expanding the first opening, wherein the charge storage structure and the filling pillar are exposed in ends of the second opening; and forming the insulating pillar in the second opening.

16. The method of claim 15, wherein the forming the first opening comprises a dry etching process, and forming a second opening comprises a wet etching process.

17. A method for manufacturing a memory device, comprising:

forming at least three source lines over a substrate;

forming a stack structure above the at least three source lines, where the stack structure includes a plurality of first material layers and a plurality of second material layers stacked alternately;

forming a hole in the stack structure;

forming a semiconducting layer in the hole;

forming a filling pillar in the semiconducting layer;

removing the plurality of second material layers to form a plurality of horizontal openings;

forming a plurality of charge storage structures and a plurality of gate layers in the plurality of horizontal openings, so as to form a gate stack structure including the gate layers and the first material layers;

patterning the semiconducting layer in the hole to form at least three channel pillars, wherein the at least three channel pillars are electrically isolated from one another, and the charge storage structure are disposed within each of the plurality of gate layers surrounding the at least three channel pillars;

forming an insulating pillar in a remaining space of the hole; and forming at least three bit lines over the gate stack structure, wherein the at least three bit lines are electrically connected to the at least three channel pillars, wherein the at least three bit lines extending in a first direction, and the at least three source lines extending in a second direction, and an included angle between the first direction and the second direction is an acute angle.

18. The method of claim 17, wherein patterning the semiconducting layer and forming the insulating pillar comprising:

forming a first opening in the semiconducting layer, wherein the conductive layer and the filling pillar are exposed in ends of the first opening;

form a second opening by expanding the first opening, wherein the charge storage structure and the filling pillar are exposed in ends of the second opening; and forming the insulating pillar in the second opening.

19. The method of claim 18, wherein the forming the first opening comprises a dry etching process, and forming a second opening comprises a wet etching process.

* * * * *